(12) United States Patent
Gao et al.

(10) Patent No.: US 11,335,238 B2
(45) Date of Patent: May 17, 2022

(54) SIGNAL TRANSMISSION METHOD AND APPARATUS, AND DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Xianyong Gao, Beijing (CN); Sijun Lei, Beijing (CN); Xu Lu, Beijing (CN); Liang Gao, Beijing (CN); Shanbin Chen, Beijing (CN); Bo Ran, Beijing (CN); Yansheng Sun, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 16/643,136

(22) PCT Filed: Jul. 26, 2019

(86) PCT No.: PCT/CN2019/097830
§ 371 (c)(1),
(2) Date: Feb. 28, 2020

(87) PCT Pub. No.: WO2020/020324
PCT Pub. Date: Jan. 30, 2020

(65) Prior Publication Data
US 2020/0335029 A1     Oct. 22, 2020

(30) Foreign Application Priority Data

Jul. 27, 2018 (CN) .......................... 201810848255.1
Jan. 2, 2019 (CN) .......................... 201910002796.7

(51) Int. Cl.
*G09G 3/20*     (2006.01)
*G02F 1/1333*   (2006.01)
(Continued)

(52) U.S. Cl.
CPC ....... *G09G 3/2096* (2013.01); *G02F 1/13338* (2013.01); *G02F 1/136286* (2013.01);
(Continued)

(58) Field of Classification Search
CPC ................................................. G09G 3/2096
See application file for complete search history.

(56) References Cited

U.S. PATENT DOCUMENTS 7,609,125 B2  10/2009  van Quach et al.
7,965,367 B2   6/2011  Oohira
(Continued)

FOREIGN PATENT DOCUMENTS

CN   1829414 A    9/2006
CN   101197114 A  6/2008
(Continued)

OTHER PUBLICATIONS

First Office Action issued in corresponding Chinese Application No. 201910002796.7, dated May 27, 2020, with English language translation.
(Continued)

*Primary Examiner* — Gustavo Polo
(74) *Attorney, Agent, or Firm* — McDermott Will & Emery LLP

(57) ABSTRACT

A signal transmission method is applied to a receiving terminal so as to improve the anti-interference capability of the signals on the transmission line, and the signal transmission method includes: receiving a signal sent by a transmitting terminal through a transmission line; detecting whether there is a transmission error in the received signal;
(Continued)

and when there is a transmission error in the received signal, adjusting at least one parameter of specified parameters affecting an anti-interference capability of signals on the transmission line, and/or controlling the transmitting terminal to adjust the at least one parameter of the specified parameters affecting the anti-interference capability of signals on the transmission line.

18 Claims, 8 Drawing Sheets

(51) Int. Cl.
  *G02F 1/1362*   (2006.01)
  *G06F 3/041*   (2006.01)
  *H01L 27/32*   (2006.01)
  *H01L 51/56*   (2006.01)
  *H04L 1/00*   (2006.01)
  *H04B 10/2569*   (2013.01)
  *H04L 1/20*   (2006.01)
  *G06F 1/18*   (2006.01)
  *H05K 1/02*   (2006.01)
  *G06F 30/39*   (2020.01)
  *H04L 25/02*   (2006.01)

(52) U.S. Cl.
  CPC ............ *G06F 1/189* (2013.01); *G06F 3/0412* (2013.01); *G06F 30/39* (2020.01); *H01L 27/323* (2013.01); *H01L 27/3276* (2013.01); *H01L 51/56* (2013.01); *H04B 10/2569* (2013.01); *H04L 1/00* (2013.01); *H04L 1/203* (2013.01); *H05K 1/0245* (2013.01); *G06F 2203/04103* (2013.01); *G09G 2310/08* (2013.01); *G09G 2320/06* (2013.01); *G09G 2330/06* (2013.01); *G09G 2370/06* (2013.01); *G09G 2370/08* (2013.01); *G09G 2370/10* (2013.01); *H01L 2223/6638* (2013.01); *H01L 2227/323* (2013.01); *H04L 25/0272* (2013.01); *H05K 2201/09227* (2013.01); *H05K 2201/09727* (2013.01); *H05K 2201/09736* (2013.01)

(56) References Cited

U.S. PATENT DOCUMENTS

| | | |
|---|---|---|
| 8,044,746 B2 | 10/2011 | Blair et al. |
| 8,378,223 B1 | 2/2013 | Shiue et al. |
| 9,559,401 B2 | 1/2017 | Kawai |
| 10,108,057 B2 | 10/2018 | Enami |
| 2004/0037050 A1 | 2/2004 | Nakayama et al. |
| 2006/0197625 A1 | 9/2006 | Kashiwakura |
| 2008/0129713 A1 | 6/2008 | Chen et al. |
| 2008/0266029 A1 | 10/2008 | Mi et al. |
| 2009/0188702 A1 | 7/2009 | Muro et al. |
| 2009/0207367 A1 | 8/2009 | Oohira |
| 2011/0085100 A1 | 4/2011 | Kim et al. |
| 2014/0078133 A1 | 3/2014 | Lee et al. |
| 2015/0085452 A1 | 3/2015 | Chou et al. |
| 2016/0335388 A1 | 11/2016 | Hayashi et al. |
| 2017/0132966 A1 | 5/2017 | Lim et al. |
| 2018/0088386 A1 | 3/2018 | Enami |
| 2018/0120616 A1 | 5/2018 | Kanou |
| 2019/0148316 A1 | 5/2019 | Kubo et al. |

FOREIGN PATENT DOCUMENTS

| | | |
|---|---|---|
| CN | 101295809 A | 10/2008 |
| CN | 101516160 A | 8/2009 |
| CN | 102867488 A | 1/2013 |
| TW | 201413677 A | 4/2014 |
| WO | 2018003332 A1 | 1/2018 |

OTHER PUBLICATIONS

International Search Report and Written Opinion issued in PCT/CN2019/097879 dated Oct. 9, 2019, with English translation.
International Search Report and Written Opinion issued in PCT/CN2019/097905 dated Oct. 9, 2019, with English translation.
Non-Final Office Action issued in U.S. Appl. No. 16/640,870, dated Dec. 22, 2020.
Final Office Action issued in U.S. Appl. No. 16/640,870, dated May 28, 2021.
Non-Final Office Action issued in U.S. Appl. No. 16/642,044, dated Oct. 14, 2021.
Notice of Allowance issued in U.S. Appl. No. 16/640,870, dated Sep. 13, 2021.

SIGNAL TRANSMISSION METHOD AND APPARATUS, AND DISPLAY DEVICE

CROSS-REFERENCE TO RELATED APPLICATIONS

This application is a national phase entry under 35 USC 371 of International Patent Application No. PCT/CN2019/097830 filed on Jul. 26, 2019, which claims priorities to Chinese Patent Application No. 201810848255.1, filed with the Chinese Patent Office on Jul. 27, 2018, and Chinese Patent Application No. 201910002796.7, filed with the Chinese Patent Office on Jan. 2, 2019, which are incorporated herein by reference in their entirety.

TECHNICAL FIELD

The present disclosure relates to the field of signal transmission technologies, and in particular, to signal transmission method and apparatus, and a display device.

BACKGROUND

A display device includes a display panel and a driving structure used for driving the display panel. The driving structure includes a controller and a driver. With the continuous improvement of resolution of the display device, a signal transmission rate between the controller and the driver is also getting higher and higher. Accordingly, high-speed transmission of signals between the controller and the driver need to be achieved through the peer-to-peer (P2P) technology. The P2P technology refers to a technology in which a receiving terminal and a transmitting terminal of a signal transmission are directly connected without a relay device to transmit signals.

SUMMARY

In one aspect, a signal transmission method applied to a receiving terminal is provided, and the signal transmission method includes: receiving a signal sent by a transmitting terminal through a transmission line; detecting whether there is a transmission error in the received signal; when there is a transmission error in the received signal, adjusting at least one parameter of specified parameters affecting an anti-interference capability of signals on the transmission line, and/or, controlling the transmitting terminal to adjust at least one parameter of the specified parameters affecting the anti-interference capability of the signals on the transmission line.

In some embodiments, adjusting at least one parameter of specified parameters affecting an anti-interference capability of signals on the transmission line, and/or, controlling the transmitting terminal to adjust at least one parameter of the specified parameters affecting the anti-interference capability of the signals on the transmission line includes: determining target parameter information based on the received signal; the target parameter information includes first indication information of at least one adjustable parameter of the specified parameters, and the first indication information includes at least one target parameter value or target adjustment degree information; and according to the target parameter information, adjusting at least one parameter corresponding to the target parameter information, and/or, controlling the transmitting terminal to adjust at least one parameter corresponding to the target parameter information.

In some embodiments, determining the target parameter information based on the received signal, includes: determining a degree parameter of the received signal, and the degree parameter is configured to reflect a severity of the transmission error the received signal; inquiring a pre-established corresponding relationship between degree parameter ranges and parameter information, and obtaining parameter information corresponding to a degree parameter range where the degree parameter of the received signal is located, the parameter information being used as the target parameter information; each parameter information recorded in the corresponding relationship includes first indication information of at least one parameter of the specified parameters, and the first indication information includes at least one target parameter value or target adjustment degree information.

In some embodiments, the specified parameters include at least one target first parameter adjustable by the transmitting terminal and at least one target second parameter adjustable by the receiving terminal; the first indication information includes at least one target parameter value; according to the target parameter information, controlling the transmitting terminal to adjust at least one parameter corresponding to the target parameter information, includes: in a case where the target parameter information includes at least one target parameter value of the at least one first parameter, sending the at least one target parameter value of the at least one first parameter to the transmitting terminal to control the transmitting terminal to adjust at least one parameter value of the at least one first parameters, so that the at least one adjusted parameter value of the at least one first parameter is equal to corresponding target parameter value in the target parameter information; according to the target parameter information, adjusting at least one parameter corresponding to the target parameter information, includes: in a case where the target parameter information includes at least one target parameter value of the at least one second parameter, adjusting at least one parameter value of the at least one second parameter, so that at least one adjusted parameter value of the at least one second parameter is equal to a corresponding target parameter value in the target parameter information.

In some embodiments, the specified parameters include at least one first parameter adjustable by the transmitting terminal and at least one second parameter adjustable by the receiving terminal, and the first indication information includes target adjustment degree information; according to the target parameter information, controlling the transmitting terminal to adjust at least one parameter corresponding to the target parameter information, includes: in a case where target parameter information includes target adjustment degree information of the at least one first parameter, sending the target adjustment degree information of the at least one first parameter to the transmitting terminal to control the transmitting terminal to adjust the at least one first parameter according to corresponding target adjustment degree information of the target parameter information; according to the target parameter information, adjusting at least one parameter corresponding to the target parameter information, includes: in a case where the target parameter information includes target adjustment degree information of the at least one second parameter, adjusting the at least one second parameter according to the corresponding target adjustment degree information of the target parameter information.

In some embodiments, the at least one first parameter includes at least one of a driving current of the receiving terminal, a swing level, and a slew rate; the at least one second parameter includes at least one of a swing level, an equalizer, a matching resistance of the receiving terminal, filtering parameters of a filter and a driving current of the receiving terminal.

In some embodiments, adjusting at least one parameter of specified parameters affecting an anti-interference capability of signals on the transmission line, and/or, controlling the transmitting terminal to adjust at least one parameter of the specified parameters affecting the anti-interference capability of the signals on the transmission line, includes: according to a priority order of the specified parameters, adjusting parameters that are adjustable by the receiving terminal sequentially until an adjustment end condition is reached, and/or, controlling the transmitting terminal to adjust parameters that are adjustable by the transmitting terminal sequentially until the adjustment end condition is reached.

In some embodiments, the adjustment end condition includes at least one of: there being no transmission error in a signal received again sent by the transmitting terminal; adjustment of all the specified parameters being completed; and adjustment of a specified number of parameters of the specified parameters being completed.

In some embodiments, according to a priority order of the specified parameters, adjusting parameters that are adjustable by the receiving terminal sequentially, and/or, controlling the transmitting terminal to adjust parameters that are adjustable by the transmitting terminal sequentially, includes: according to the priority order of the specified parameters, performing at least one of: increasing at least one parameter value of the at least one third parameter; sending second indication information to the transmitting terminal, and the second indication information being configured to indicate the transmitting terminal to increase at least one parameter value of the at least one first parameter performing adjustment process of at least one fourth parameter at least once, the adjustment process of the at least one fourth parameter including increasing or decreasing at least one parameter value of the at least one fourth parameters. The at least one third parameter includes at least one of a swing level and a driving current of the receiving terminal. The at least one first parameter includes at least one of a driving current of the transmitting terminal, a swing and a slew rate. The at least one fourth parameters includes at least one of an equalizer, a matching resistance of the receiving terminal and filtering parameters of a filter. In the specified parameters, a priority of the at last one third parameter is greater than a priority of the at last one first parameter, and the priority of the at least one first parameter is greater than a priority of the at least one fourth parameter.

In some embodiments, the signal is transmitted on the transmission line in a form of data packets, and detecting whether there is a transmission error in the received signal includes any one of the following combinations: a, recording a packet loss rate of the signal received through the transmission line, and determining that there is a transmission error in the received signal when the packet loss rate is greater than a specified packet loss rate threshold; b, determining that there is a transmission error in the received signal. The specified condition includes at least one of: a number of received data packets with a transmission error within a specified time being greater than a first specified number threshold; a number of data packets with a transmission error in a received specified number of data packets being greater than a second specified number threshold; a number of consecutive data packets with a transmission error in the received specified number of data packets being greater than a third specified number threshold.

In some embodiments, the signal transmission method further includes: after the at least one parameter of the specified parameters is adjusted, restoring corresponding at least one parameter of the specified parameters to initial setting when a restoration condition is reached, the initial setting being a setting before the corresponding at least one parameter of the specified parameters is adjusted. The restoration condition includes at least one of: a time interval between a current moment and an adjusting moment of the specified parameters being greater than a specified time interval; the receiving terminal being powered on again.

In another aspect, a signal transmission method is provided. The signal transmission method is applied to a transmitting terminal, and the signal transmission method includes: sending a signal to a receiving terminal through a transmission line; receiving a control signal sent by the receiving terminal, the control signal being sent by the receiving terminal after a transmission error in a received signal is detected; and adjusting at least one parameter of the specified parameters affecting an anti-interference capability of signals on the transmission line based on the received control signal.

In some embodiments, the control signal includes first indication information of at least one first parameter each first parameter is a parameter adjustable by the transmitting terminal in the specified parameters affecting the anti-interference capability of the signals on the transmission line, and the first indication information includes at least one target parameter value or target adjustment degree information; adjusting at least one parameter of the specified parameters affecting the anti-interference capability of signals on the transmission line based on the received control signal includes: adjusting the at least one first parameter based on first indication information of the at least one first parameter included in the received control signal.

In some embodiments, the first indication information includes at least one target parameter value, and adjusting the at least one first parameter based on the first indication information of the at least one first parameter included in the received control signal includes: adjusting the at least one parameter value of the at least one first parameter, so that adjusted at least one parameter value of the at least one first parameter is equal to the at least one target parameter value included in the received first indication information.

In some embodiments, the first indication information includes target adjustment degree information, and adjusting the at least one first parameter based on first indication information of the at least one first parameter included in the received control signal includes: adjusting the at least one first parameter according to the target adjustment degree information included in the received first indication information.

In some embodiments, the control signal includes second indication information of the at least one first parameters. Each first parameter is a parameter adjustable by the transmitting terminal in the specified parameters affecting the anti-interference capability of the signals on the transmission line, and the second indication information is configured to indicate the transmitting terminal to increase at least one parameter value of the at least one first parameter. Adjusting at least one parameter of the specified parameters affecting the anti-interference capability of the signals on the transmission line based on the received control signal, includes: increasing the at least one parameter value of the at least one first parameter based on second indication information of the at least one first parameter included in the received control signal.

In some embodiments, the signal transmission method further includes: after the at least one parameter of the specified parameters is adjusted, restoring a corresponding parameter of the specified parameters to initial setting when a restoration condition is reached, the initial setting being a setting before the corresponding parameter of the specified parameters is adjusted. The restoration condition includes at least one of: a time interval between a current moment and an adjusting moment of the specified parameters being greater than a specified time interval, and the receiving terminal being powered on again.

In yet another aspect, a signal transmission apparatus is provided. The signal transmission apparatus is applied to a receiving terminal, and the signal transmission apparatus includes: a memory and a processor. The memory is configured to store executable instructions. The processor is configured to execute the executable instructions to perform one or more steps in the signal transmission method according to any of the embodiments above.

In yet another aspect, a signal transmission apparatus is provided. The signal transmission apparatus is applied to a transmitting terminal, and the signal transmission apparatus includes: a memory and a processor. The memory is configured to store executable instructions. The processor is configured to execute the executable instructions to perform one or more steps in the signal transmission method according to any one of the embodiments above.

In yet another aspect, a non-transitory computer-readable storage medium is provided. The non-transitory computer-readable storage medium stores instructions that, when run on a processing component, cause the processing component to perform the signal transmission method as according to embodiments above.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely some embodiments of the present disclosure, and a person of ordinary skill in the art can obtain other drawings according to these drawings.

The accompanying drawings herein are incorporated in and constitute a part of this specification, illustrate embodiments consistent with the present disclosure, and explain principle(s) of the present disclosure together with the description.

DETAILED DESCRIPTION

In order to make objectives, technical solutions and technical effects of the present disclosure more clearly, embodiments of the present disclosure will be described in further detail below with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Figure 1:
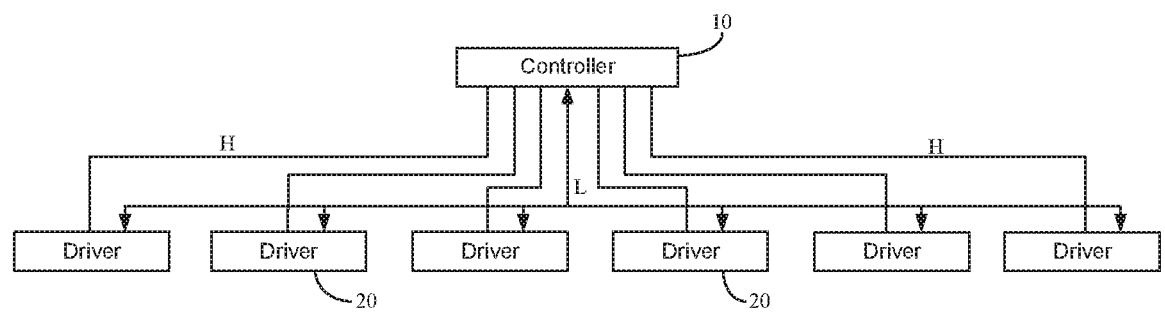
FIG. 1 is a schematic diagram of an implementation environment for a signal transmission method, in accordance with some embodiments.

Referring to FIG. 1, FIG. 1 is a schematic diagram of an implementation environment for a signal transmission method in accordance with some embodiments of the present disclosure. The signal transmission method is applied to a display device, and the display device may be any product or component with a display function, such as a notebook computer, a television, a liquid crystal panel, an electronic paper, an organic light-emitting diode (OLED) panel, a mobile phone, a tablet computer, a display, a digital photo frame or a navigator.

As shown in FIG. 1, the display device includes a controller 10 and a plurality of drivers 20. The controller 10 is coupled to the plurality of drivers 20 through a plurality of transmission lines H that are in one-to-one correspondence with the plurality of drivers, and signals between the controller 10 and a driver 20 is transmitted through a transmission line H. In some possible designs, the controller 10 is also coupled to a signal line L, and each driver 20 is coupled to the signal line L.

The driver 20 may be a source driver chip or agate driver chip. The controller 10 may be any one of a timing controller, a graphics processor, a system on chip (SOC), and a microcontroller unit (MCU) that is integrated in a timing controller.

Figure 2:
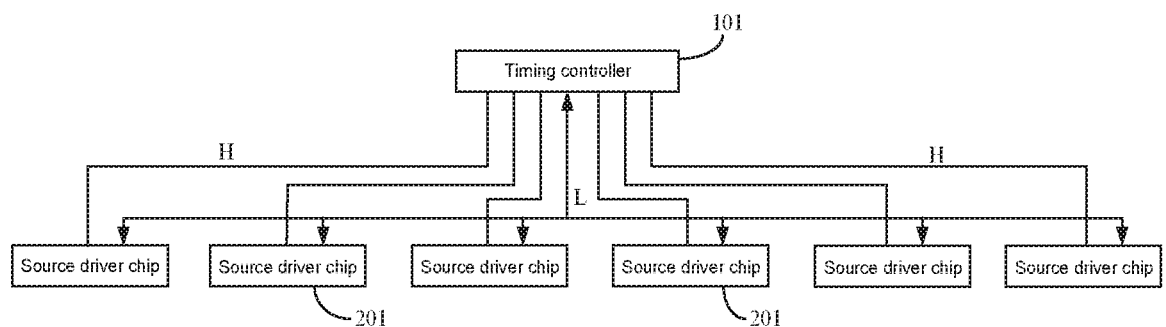
FIG. 2 is a schematic diagram of an implementation environment for another signal transmission method, in accordance with some embodiments.

Referring to FIG. 2, FIG. 2 is shown by taking an example where the controller is the timing controller 101 and the driver is the source driver chip 201. The timing controller 101 is coupled to a plurality of source driver chips 201 through the plurality of transmission lines H that are in one-to-one correspondence with the plurality of transmission lines H. The timing controller 101 is also coupled to a signal line L, and each source driver chip 201 is coupled to the signal line L.

In FIGS. 1 and 2, a signal transmission rate in the signal line L is less than a signal transmission rate in the transmission line H. The signal line L is called a low-speed signal line and is generally used to identify a level state. The transmission line H is called a high-speed signal line or a high-speed transmission line and is generally used for transmitting a high-speed differential signal. For example, the transmission line H may be a differential signal line. Generally, signals on the differential signal line are unidirectionally transmitted. For example, in FIG. 1, a signal transmission direction of the differential signal line is a direction from the controller to the driver. In FIG. 2, a signal transmission direction of the differential signal line is a direction from the timing controller to the source driver chip.

In some embodiments of the present disclosure, the transmitting terminal and the receiving terminal are relative concepts. One terminal that transmits signals is referred to as the transmitting terminal, and another terminal that receives signals is referred to as the receiving terminal. The transmitting terminal and the receiving terminal may be interchanged according to the signal transmission direction. For example, in a case where the controller sends signals to the driver through the transmission line, the transmitting terminal is the controller and the receiving terminal is the driver. There are various manners to transmit signals between the transmitting terminal and the receiving terminal. For example, the transmitting terminal and the receiving terminal may transmit signals at a high speed through a P2P technology.

It will be noted that in a conventional panel driving circuit, a clock is usually embedded, and the clock is restored by the source driver chip according to characteristics of signals received through a transmission line (i.e. the above-mentioned transmission line H), and an additional signal line (i.e., the signal line L described above) is used to identify the level state. In a process of transmitting signals from the transmitting terminal to the receiving terminal through the transmission line, interference may occur due to a high transmission rate in the transmission line. For example, if a mobile phone being called is proximate to a display device that is in operation, a crosstalk may occur between signals transmitted at a high-speed rate in the display device and global system for mobile communication (GSM) signals, thereby causing an abnormal display of the display device.

In some embodiments of the present disclosure, an anti-interference capability of signals on a transmission line in a signal transmission process may be improved by adjusting specified parameters in the transmitting terminal and the receiving terminal that affect the anti-interference capability of the signals. The specified parameters may include first parameters adjustable by the transmitting terminal and second parameters adjustable by the receiving terminal. In order to facilitate understanding, the embodiments of the present disclosure briefly introduce specific parameters that affect the anti-interference capability of signals.

The first parameters adjustable by the transmitting terminal include at least one of a driving current of the transmitting terminal, a swing level, and a slew rate (SR).

The driving current of the transmitting terminal is a current for driving the transmitting terminal to operate. The swing level is used for representing a fluctuation degree of a signal, and the greater the swing level is, the more obvious the fluctuation of the signal is. The slew rate refers to a voltage slew rate of a signal output by the transmitting terminal. In these parameters, the magnitude of the driving current of the transmitting terminal is proportional to a magnitude of the swing level. That is, the greater the driving current of the transmitting terminal is, the greater the swing level is. The greater the swing level is, the greater an eye height of a signal eye diagram is, and the stronger the anti-interference capability of signals on the transmission line. The greater the slew rate is, the greater an eye width of a signal eye diagram is, and the stronger the anti-interference capability of the signals on the transmission line. The signal eye diagram is a diagram observed on an oscilloscope in a case where the performance of signals on the transmission line is estimated and improved by using an experimental method, and the signal eye diagram may represent a transmission quality of signals.

The second parameters adjustable by the receiving terminal include at least one of a swing level, an equalizer, a matching resistance of the receiving terminal, filtering parameters of a filter, and a driving current of the receiving terminal.

The equalizer refers to a device for correcting amplitude frequency characteristics and phase frequency characteristics of a transmission channel during the signal transmission. The equalizer may be a software module or a hardware device. The matching resistance of the receiving terminal refers to a resistance of a resistor provided in the receiving terminal. In some embodiments of the present disclosure, the resistor is an adjustable resistor. In a case where impedance of a high-speed signal line for transmitting high-speed signals does not match the resistance of the receiving terminal (not equal or not approximately equal in magnitude), energy of the high-speed signals cannot be consumed at the receiving terminal. In this case, the high-speed signals are reflected at the receiving terminal, and the reflected high-speed signals are transmitted to the transmitting terminal along the high-speed signal line, which will interfere with the high-speed signals transmitted from the transmitting terminal to the receiving terminal. By adjusting the resistance to match the impedance of the high-speed signal line, the resistor may consume the energy of the high-speed signals at the receiving terminal, thereby reducing or avoiding signal reflection phenomenon generated after the high-speed signals reaches the receiving terminal, and avoiding high-speed signals being actually transmitted being interfered by the reflected high-speed signals.

The driving current of the receiving terminal refers to a current used for driving the receiving terminal to operate, and the greater the driving current of the receiving terminal is, the stronger the capability of the receiving terminal to receive high-speed signals. In this way, the receiving terminal may receive high-speed signals with weak signal intensity, thereby avoiding the loss of the high-speed signals, and enhancing the anti-interference capability of the high-speed signals.

The filter may be provided in the front of the receiving terminal to filter noise signals in signals transmitted on the transmission line, so that signals actually transmitted by the transmitting terminal normally passes through the filter, and meanwhile noise signals are filtered. The filter may be a filter in a form of hardware. For example, the filter may be a filter in a form of a double-ended circuit, or a single-ended circuit or the like, or a filter in a form of a device such as a ceramic filter. In some possible designs, the filter may also be a filter in a form of software. For example, the filter may be a digital filter. It will be noted that the filter in the form of hardware may be a filter made of shielding materials such as copper foil, aluminum foil, conductive fabric or wave absorbing materials, but these may increase the cost of the equipment. In a case where the filter is a filter in the form of software, the anti-interference capability of the signals on the transmission line may be improved by the adjusting parameter of the filter which affects the anti-interference capability of the signals without adding the shielding materials, thereby reducing the cost.

In a case where the filter is a filter in the form of hardware, signals transmitted by the transmitting terminal through the transmission line are filtered by the filter and then transmitted to the receiving terminal. In a case where the filter is a filter in the form of software, in one possible implementation manner, signals transmitted by the transmitting terminal through the transmission line are first filtered by the filter and then transmitted to the receiving terminal. In another possible implementation manner, the receiving terminal controls whether high-speed signals transmitted by the transmitting terminal passes through the filter according to conditions. For the another possible implementation manner, for example, in a case where the receiving terminal detects a large difference between frequencies of a useful signal and a noise signal in the received signals (for example, the useful signal has a frequency of 400 MHz and the noise signal has a frequency of 600 MHz), the receiving terminal needs to adjust the filtering parameter of the filter, and control signals sent by the transmitting terminal to pass through the filter. In a case where the receiving terminal detects that frequencies of the useful signal and the noise signal in the received signals are smaller (for example, the frequency of the useful signal and the frequency of the noise signal are both around 400 MHz), since the frequency of the useful signal and the frequency of the noise signal cannot be distinguished, the receiving terminal does not need to adjust the filtering parameter of the filter, and controls signals transmitted by the transmitting terminal not to pass through the filter.

Figure 3:
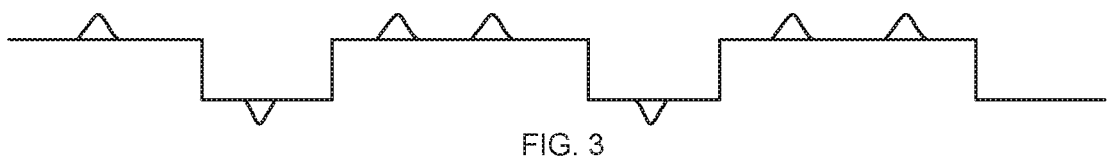
FIG. 3 is a schematic diagram of an exemplary signal, in accordance with some embodiments.
Figure 4:
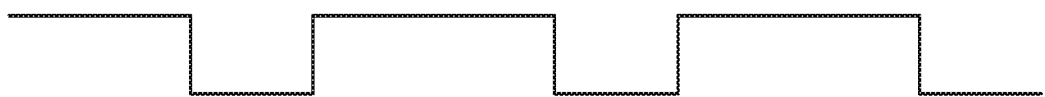
FIG. 4 is a schematic diagram of another exemplary signal, in accordance with some embodiments.

For example, the filter may be a bandpass filter. Referring to FIGS. 3 and 4, FIG. 3 is a schematic diagram of a signal interfered by a noise signal according to some embodiments of the present disclosure, and FIG. 4 is a schematic diagram of a signal obtained after the signal interfered by the noise signal in FIG. 3 is filtered by a bandpass filter. In a case where the bandpass filter is adopted to filter the signal interfered by the noise signal, the noise signal will be filtered out, so that the accuracy of the signal received by the receiving terminal is improved.

In some embodiments, the filtering parameters of the filter refers to parameters that can affect a filtering effect of the filter. For example, the filtering parameters of the filter may include filtering intensity and/or filtering frequency band. For example, when the receiving terminal adjusts the filtering parameters of the filter, the intensity of filtering the noise signal may be increased by increasing the filtering intensity, or setting the filtering frequency band as the noise frequency band, or increasing the filtering intensity and setting the filtering frequency band as noise frequency bands at a same time, thereby increasing effect of filtering the noise signal.

In the second parameters, magnitudes of the swing level and the driving current of the receiving terminal are both proportional to the anti-interference capability of signals. That is, the greater the swing level and the driving current of the receiving terminal are, the stronger the anti-interference capability of signals is. The relationship between the equalizer, the matching resistance of the receiving terminal and the filtering parameters of the filter and the anti-interference capability of signals is as follows. The anti-interference capability of signals is firstly enhanced with increases of the equalizer, the matching resistance of the receiving terminal and the filtering parameters of the filter, and after the equalizer, the matching resistance of the receiving terminal and the filtering parameters of the filter are increased to certain values, the anti-interference capability of signals decreases with the increases of the equalizer, the matching resistance of the receiving terminal and the filtering parameters of the filter. Therefore, the equalizer, the matching resistance of the receiving terminal and the filtering parameters of the filter need to be adjusted according to actual conditions.

Figure 5:
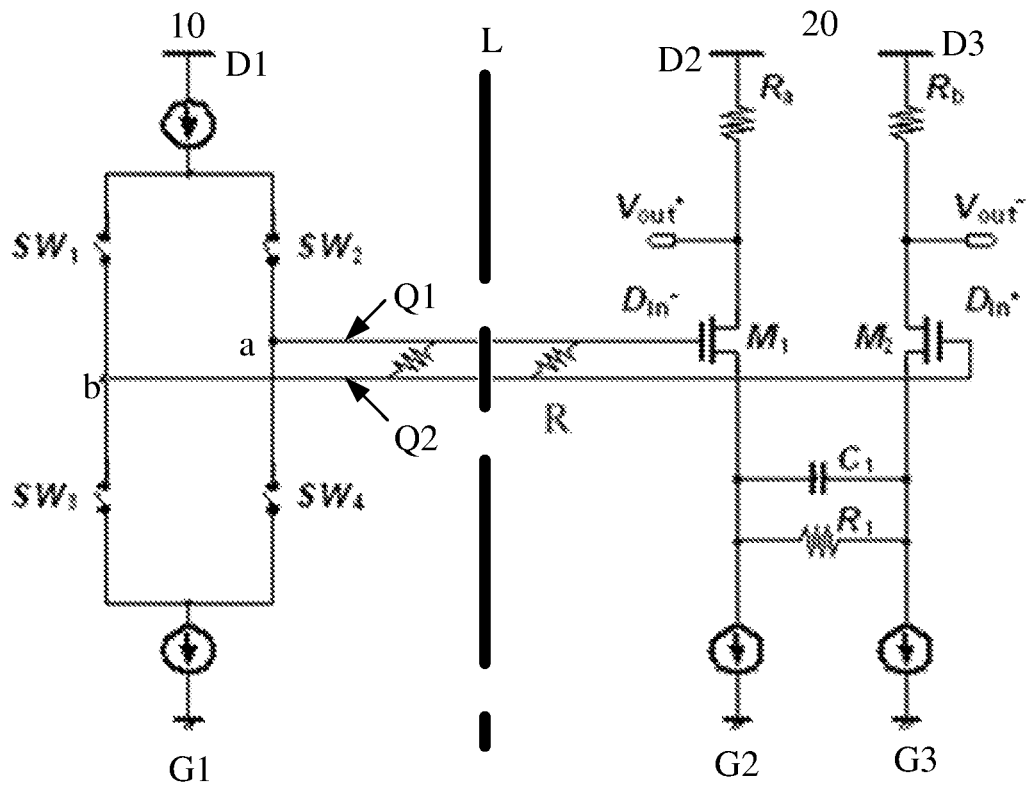
FIG. 5 is a schematic diagram showing circuit principles of exemplary transmitting and receiving terminals, in accordance with some embodiments.

In some embodiments, as for structures of the transmitting terminal and the receiving terminal, in a case where circuit structures of the transmitting terminal and the receiving terminal are different, and adjustment manners of the parameters are different. Referring to FIG. 5, FIG. 5 is a schematic diagram showing circuit structures of a transmitting terminal and a receiving terminal in accordance with an exemplary embodiment. In FIG. 5, the left side of the dotted line L is the transmitting terminal 10, the right side of the dotted line L is the receiving terminal 20, and transmission lines between the two are differential signal lines. The differential signal lines include a first transmission signal line Q1 and a second transmission signal line Q2.

The transmitting terminal 10 includes: two wires in parallel between a first signal terminal D1 and a ground terminal G1, and four switches of $SW_1$, $SW_2$, $SW_3$ and $SW_4$. The switch $SW_1$ and the switch $SW_3$ are connected in series on one of the two wires, and the switch $SW_2$ and the switch $SW_4$ are connected in series on another one of the two wires.

The receiving terminal 20 includes: a first wire disposed between a first power terminal D2 and a ground terminal G2, a second wire disposed between a second power terminal D3 and a ground terminal G3, a first transistor $M_1$ whose gate is coupled to the first transmission signal line Q1 (corresponding to the transmission line H in FIGS. 1 and 2), a second transistor $M_2$ whose gate is coupled to the second transmission signal line Q2, and a matching resistor R of the receiving terminal. One end of the first transmission signal line Q1 is connected to a potential point a, and another end of the first transmission signal line Q1 is connected to the gate of the first transistor $M_1$. One end of the second transmission signal line Q2 is connected to a potential point b, and another end of the second transmission signal line Q2 is connected to the gate of the second transistor $M_2$.

The matching resistor R of the receiving terminal is disposed between the first transmission signal line Q1 and the second transmission signal line Q2, the potential point a is a potential point between the switch $SW_2$ and the switch $SW_4$, and the potential point b is a potential point between the switch $SW_1$ and the switch $SW_3$. A signal input $Din^+$ of the receiving terminal 20 is the gate of the second transistor $M_2$, and a signal input $Din^-$ of the receiving terminal 20 is the gate of the first transistor $M_1$. A signal output $Vout^+$ of the receiving terminal 20 is disposed between the first power terminal D2 and a first electrode of the first transistor $M_1$, and a signal output $Vout^-$ of the receiving terminal 20 is disposed between the second power terminal D3 and a first electrode of the second transistor $M_2$. A second electrode of the first transistor $M_1$ is connected to the ground terminal G2, and a second electrode of the second transistor $M_2$ is connected to the ground terminal G3. The first electrode and the second electrode each are one of a source and a drain. That is, in a case where the first electrode is a source, the second electrode is a drain, and in a case where the first electrode is a drain, the second electrode is a source.

In some embodiments, the receiving terminal 20 further includes: a resistor $R_a$ in series between the first power terminal D2 and the first electrode of the first transistor $M_1$, a resistor $R_b$ in series between the second power terminal D3 and the first electrode of the second transistor $M_2$, and a capacitor $C_1$ and a resistor $R_1$ connected in parallel between the second electrode of the first transistor $M_1$ and the second electrode of the second transistor $M_2$. The resistor $R_a$ and the resistor $R_b$ are adjustable resistors.

For the transmitting terminal 10, a flow direction of the driving current $I_{TX}$ of the transmitting terminal may be controlled by simultaneously turning on the switch $SW_1$ and the switch $SW_4$, or simultaneously turning on the switch $SW_2$ and the switch $SW_3$. For example, in a case where the switch $SW_1$ and the switch $SW_4$ are turned on simultaneously, the driving current of the transmitting terminal passes through the switch $SW_1$, the potential point b, the second transmission signal line Q2, the resistor R, the first transmission signal line Q1, the potential point a, and the switch $SW_4$. In a case where the switch $SW_2$ and the switch $SW_3$ are turned on simultaneously, the driving current of the transmitting terminal passes through the switch $SW_2$, the potential point a, the first transmission signal line Q1, the resistor R, the second transmission signal line Q2, the potential point b, and the switch $SW_3$.

In some embodiments, a magnitude of the driving current $I_{TX}$ of the transmitting terminal 10 and/or a magnitude of the swing level of the transmitting terminal 10 may be adjusted by adjusting the switches $SW_1$ or $SW_2$. For example, the switch SW and the switch $SW_2$ are both composed of a plurality of switching transistors. In a case where the switch $SW_1$ or the switch $SW_2$ is turned on, a magnitude of the driving current $I_{TX}$ of the transmitting terminal 10 may be controlled by controlling the number of transistors in the switch SW or the switch $SW_2$ that are turned on. In a case where the resistance of the resistor R is constant, the magnitude of the swing level of the transmitting terminal 10 is proportional to the magnitude of the driving current $I_{TX}$ of the transmitting terminal 10. Therefore, it is also possible to control the magnitude of the swing level by controlling the magnitude of the driving current $I_{TX}$ of the transmitting terminal 10.

It can be seen from the above that, the slew rate refers to the voltage slew rate of a signal output from the transmitting terminal 10, that is, a change of a value of an output voltage of a device per unit time (generally in microseconds). In this way, during a conduction of the circuit of the transmitting terminal 10, the magnitude of the slew rate may be adjusted by adjusting a switching rate of a corresponding switch. For example, the switching rate of the corresponding switch is increased during the conduction of the circuit of the transmitting terminal 10, so that a change of a value of the output voltage of the switch per unit time is increased. For example, in a case where the circuit is on, voltage of the circuit is 6 V, and before the switching rate of the corresponding switch is increased, a switching rate of the switch is 2 µs. Therefore, the change of the value of the output voltage of the switch per unit time is 3 V/µs. After the switching rate of the corresponding switch is increased, the switching rate of the switch is 1 µs. Therefore, the change of the value of the output voltage of the switch per unit time is 6 V/µs. In this way, it is achieved that the magnitude of the slew rate is adjusted by adjusting the switching rate of the corresponding switch.

For the receiving terminal 20, the magnitude of the resistance of the matching resistor R of the receiving terminal and the driving current $I_{RX}$ of the receiving terminal (a current flowing through the first wire, the resistor $R_1$, and the second wire) may be directly adjusted, and the magnitude of the swing level and the magnitude of the equalizer may be adjusted by adjusting the magnitude of the capacitor $C_1$ and the magnitude of the resistor $R_1$.

It will be noted that the circuit structures of the transmitting terminal and the receiving terminal shown in FIG. 5 are only illustrated, and other forms of circuit structures of the transmitting terminal and the receiving terminal may be used in practice. For example, on the basis shown in FIG. 5, resistors and capacitors may be connected in series or in parallel, and the adjustment manners of the corresponding parameters may also be correspondingly adjusted, and the embodiments of the present disclosure are not limited thereto.

Figure 6:
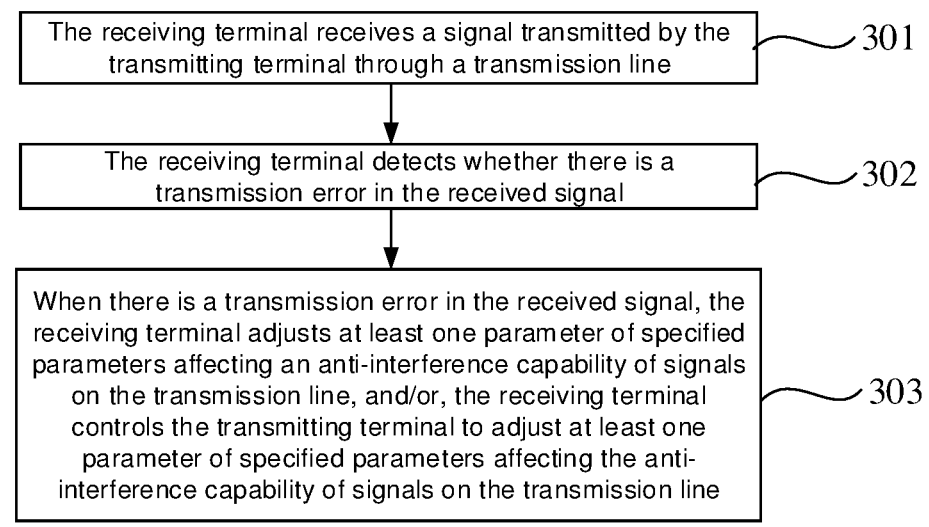
FIG. 6 is a flow diagram of a signal transmission method, in accordance with some embodiments.

Some embodiments of the present disclosure provide a signal transmission method. In a case where the signal transmission method is applied to a receiving terminal, referring to FIG. 6, the method includes the following steps.

In step 301, the receiving terminal receives a signal transmitted by the transmitting terminal through a transmission line.

In step 302, the receiving terminal detects whether there is a transmission error in the received signal.

In step 303, when there is a transmission error in the received signal, the receiving terminal adjusts at least one parameter of specified parameters affecting an anti-interference capability of signals on the transmission line, and/or, the receiving terminal controls the transmitting terminal to adjust at least one parameter of specified parameters affecting the anti-interference capability of signals on the transmission line.

In summary, in the signal transmission method provided by some embodiments of the present disclosure, when the receiving terminal detects that there is a transmission error in the received signal, the receiving terminal adjusts at least one parameter of the specified parameters affecting the anti-interference capability of the signals on the transmission line, and/or, the receiving terminal controls the transmitting terminal to adjust at least one parameter of the specified parameters affecting the anti-interference capability of the signals on the transmission line, so as to improve the anti-interference capability of the signals on the transmission line. In this way, when subjected to external electromagnetic interference, a signal on the transmission line cannot be easily lost, thereby improving an accuracy of the signal received by the receiving terminal.

In some embodiments, in the step 303, the step of when there is a transmission error in the received signal, controlling the transmitting terminal to adjust at least one parameter of the specified parameters affecting the anti-interference capability of the signals on the transmission line, includes: when there is a transmission error in the received signal, sending a control signal to the transmitting terminal to control the transmitting terminal to adjust at least one parameter of the specified parameters affecting the anti-interference capability of the signals on the transmission line.

Figure 7:
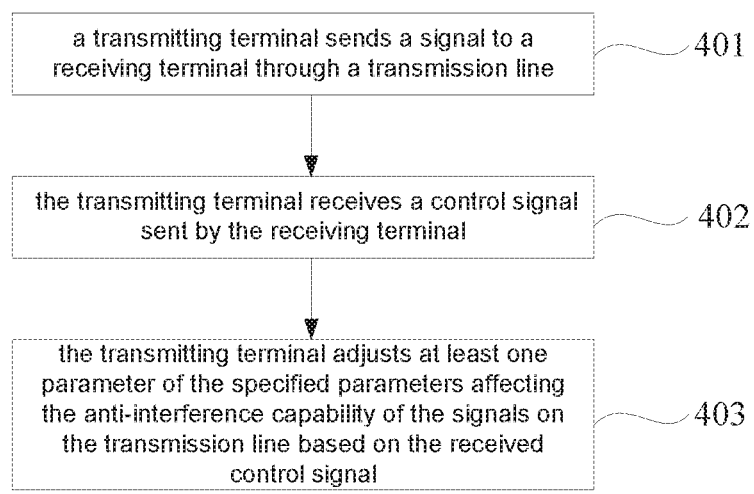
FIG. 7 is a flow diagram of another signal transmission method, in accordance with some embodiments.

Some embodiments of the present disclosure provide a signal transmission method. In a case where the signal transmission method is applied to a transmitting terminal, referring to FIG. 7, the method includes the following steps.

In step 401, a transmitting terminal sends a signal to a receiving terminal through a transmission line.

In step 402, the transmitting terminal receives a control signal sent by the receiving terminal.

The control signal is sent by the receiving terminal after it detects that there is a transmission error in the received signal. For example, the control signal may include first indication information of first parameters. The first parameters are parameters adjustable by the transmitting terminal in the specified parameters affecting the anti-interference capability of the signals on the transmission line. The first indication information includes target parameter values or target adjustment degree information. In some possible designs, the control signal may further include second indication information for indicating the transmitting terminal to increase the parameter values of the first parameters.

In step 403, the transmitting terminal adjusts at least one parameter of the specified parameters affecting the anti-interference capability of the signals on the transmission line based on the received control signal.

In summary, in the signal transmission method provided by some embodiments of the present disclosure, when the receiving terminal detects that there is a transmission error in the received signal, the receiving terminal can send a control signal to the transmitting terminal. The transmitting terminal receives the control signal and adjusts at least one parameter of the specified parameters affecting the anti-interference capability of the signals on the transmission line based on the control signal, so as to improve the anti-interference capability of the signals on the transmission line. In this way, when a signal on the transmission line is subjected to external electromagnetic interference, the signal on the transmission line cannot be easily lost, thereby improving an accuracy of the signal received by the receiving terminal.

In the embodiments of the present disclosure, in a case where the receiving terminal detects that there is a transmission error in the received signal, there may be various manners to adjust at least one parameter of the specified parameters, and the embodiments of the present disclosure are illustrated by taking the following two manners as examples.

Figure 8:
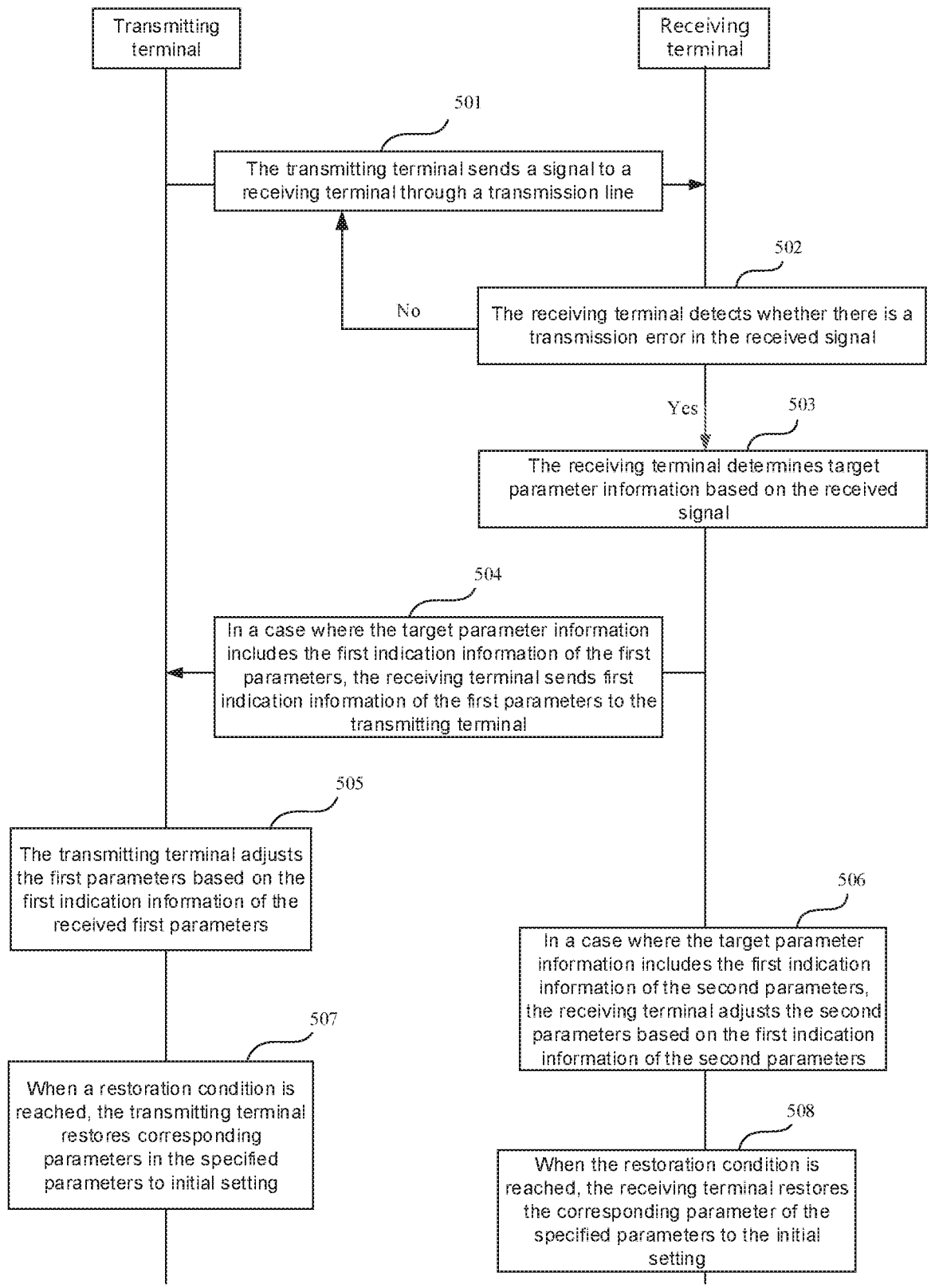
FIG. 8 is a flow diagram of yet another signal transmission method, in accordance with some embodiments.

In a first manner, in a case where the receiving terminal detects that there is a transmission error in the received signal, the receiving terminal determines target parameter information required to be adjusted first. Based on the target parameter information, the receiving terminal adjusts at least one parameter of the specified parameters affecting the anti-interference capability of the signals on the transmission line, and/or, the receiving terminal controls the transmitting terminal to adjust at least one parameter of the specified parameters affecting the anti-interference capability of the signals on the transmission line. For example, referring to FIG. 8, the signal transmission method may include the following steps.

In step 501, the transmitting terminal sends a signal to a receiving terminal through a transmission line. Then step 502 is performed.

For example, the transmitting terminal is a timing controller, the receiving terminal is a source driver chip, and the transmission line is a differential signal line. That is, the timing controller sends a high-speed differential signal to the source driver chip through the differential signal line.

In step 502, the receiving terminal detects whether there is a transmission error in the received signal.

Figure 9:
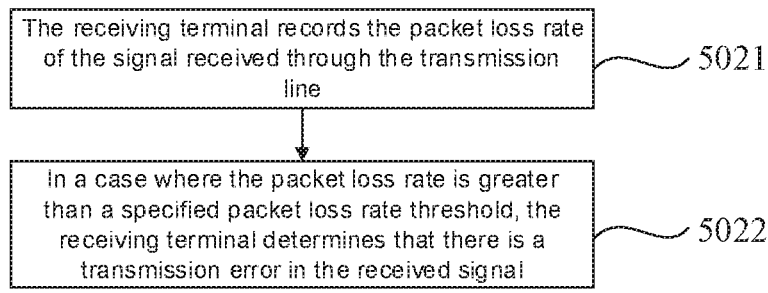
FIG. 9 is a flow diagram of a method for detecting whether there is an error in a transmitted signal, in accordance with some embodiments.

In some embodiments, in a process for the receiving terminal to receive the signal through the transmission line, the receiving terminal may determine whether there is a transmission error in the received signal by detecting a packet loss rate of the signal. In a process of the signal transmission, target data to be sent by the transmitting terminal is divided into data packets by the transmitting terminal for transmission. In a case where the transmission line between the transmitting terminal and the receiving terminal is interfered, some data packets may be lost in the transmission process. The packet loss rate is the ratio of the number of lost data packets to the total number of transmitted data packets. In a case where the packet loss rate reaches a certain value, the receiving terminal cannot restore the signal transmitted by the transmitting terminal, which may be regarded as a signal transmission error. The receiving terminal may detect whether there is an error in the received signal by detecting the packet loss rate of the received signal within a specified time. Referring to FIG. 9, the process for the receiving terminal to detect whether there is a transmission error in the received signal may include the following steps.

In step 5021, the receiving terminal records the packet loss rate of the signal received through the transmission line.

In a case where the transmitting terminal sends signal, it divides the signal into a plurality of sets of target data to transmit the signal, and divides the set of target data to be transmitted into a plurality of data packets, which are usually transmitted continuously. The size of each data packet (also referred to as data amount), and the size of each set of target data may be predetermined at the transmitting terminal and the receiving terminal. Data packets belonging to a same set of target data are identified in a predetermined manner. For example, if the target data is a frame of image data, the first data packet and the last data packet of the frame of image data both carry specified control commands. The first data packet carries an instruction CTRL_L, and the CTRL_L is provided with an identifier for indicating the start of the frame of image data. The last data packet carries an instruction CTRL_F, and the CTRL_F is provided with an identifier for indicating the end of the frame of image data. For another example, if the target data is a line of image data, the first data packet and the last data packet of the line of image data both carry specified identifiers. The first data packet carries an identifier K1, and the last packet carries an identifier K2. The K1 indicates the start of the line of the image data, and K2 indicates the end of the line of the image data.

For each received set of target data, the receiving terminal may determine the number T1 of data packets of the received set of target data by identifying the corresponding identifier, and then a packet loss rate P of the set of target data is calculated according to a packet loss rate. The calculation formula of the packet loss rate meets: $P=(T-T1)/T$, where T is the total number of data packets in the target data, and equals to the size of the target data divided by the size of the data packet. The packet loss rate of the signal is the packet loss rate of each set of target data. If it is assumed that a size of a set of target data is 100 bits, a size of a data packet is 10 bits, and the number of data packets belonging to the set of target data received by the receiving terminal is 5, then the packet loss rate of the set of target data is $(10-5)/10=50\%$.

In step 5022, in a case where the packet loss rate is greater than a specified packet loss rate threshold, the receiving terminal determines that there is a transmission error in the received signal.

The packet loss rate threshold may be set in the receiving terminal, and in a case where the receiving terminal detects that the packet loss rate of the received signal is greater than the packet loss rate threshold, it is determined that there is a transmission error in the received signal. In a case where the receiving terminal detects that the packet loss rate of the received signal is not greater than the packet loss rate threshold, it is determined that there is no transmission error in the received signal. In some embodiments, in a case where the packet loss rate of the signal is the packet loss rate of each set of target data, it is determined that there is a transmission error in the received signal when the receiving terminal detects that the packet loss rate of any set of target data is greater than the packet loss rate threshold. In a case where the packet loss rate of each set of target data detected by the receiving terminal is not greater than the packet loss rate threshold, it is determined that there is no transmission error in the received signal.

For example, it is assumed that the packet loss rate threshold is 10%, and in a case where it is detected that the packet loss rate of a certain set of target data is 50%, it is determined that there is a transmission error in the received signal.

It will be noted that the steps 5021 and 5022 are illustrated with the packet loss rate of the signal as the packet loss rate of each set of target data. In actual implementation, the algorithm for packet loss rate may have other manners, and embodiments of the present disclosure will not be described in detail.

In some other embodiments, it is determined that there is a transmission error in the received signal in a case where the received data packets satisfy specified conditions. The specified condition includes at least one of: a number of received data packets with a transmission error within a specified time being greater than a first specified number threshold, a number of data packets with a transmission error in the received specified number of data packets being greater than a second specified number threshold, and a number of consecutive data packets with a transmission error in the received specified number of data packets being greater than a third specified number threshold.

Herein, whether there is a transmission error in the data packets may be determined by detecting a signal coding format of each data packet in the received signal. Each data packet has a fixed coding format. For example, each data packet includes a preamble, a start identifier, a data bit, and an end identifier arranged in sequence. The preamble is used for indicating the receiving terminal to calibrate clock and phase, the start identifier is used for indicating the start of data transmission, the data bit is used to carry configuration data (that is, data that actually needs to be transmitted), and the end identifier is used for indicating the end of the data transmission. For example, the preamble is obtained by using Manchester encoding to encode consecutive at least 8-bit binary zeros. The start identifier includes at least 2-bit consecutive binary zeros. Configuration data carried by the data bit is data obtained by adopting Manchester encoding. The end identifier includes at least 2-bit consecutive binary ones.

After receiving each data packet, the receiving terminal detects whether there is an error in the signal coding format in the data packet. When there is an error in the signal coding format, it is determined that there is a transmission error in the data packet. If at least one of the following three specified conditions is satisfied, it is determined that there is a transmission error in the received signal: the number of received data packets with a transmission error within a specified time being greater than a first specified number threshold, the number of data packets with a transmission error in the received specified number of data packets being greater than a second specified number threshold, and the number of consecutive data packets with a transmission error in the received specified number of data packets being greater than a third specified number threshold.

It will be noted that manners of determining a transmission error in the received signal provided by the foregoing two implementations are merely illustrative. In actual implementation, other manners may be used to determine whether there is a transmission error in the received signal, which is not limited by the embodiments of the present disclosure.

In a case where the receiving terminal detects that there is a transmission error in the received signal, step 503 is performed. In a case where the receiving terminal detects that there is no transmission error in the received signal, step 501 is repeatedly performed.

In step 503, the receiving terminal determines target parameter information based on the received signal. Then step 504 is performed, or step 506 is performed, or steps 504 and 506 are performed.

The target parameter information includes first indication information of at least one adjustable parameter in the specified parameters, and the first indication information includes a target parameter value or target adjustment degree information. The target parameter value is a value of a parameter. For example, a value of a parameter is 2 or 10. The target adjustment degree information is information for reflecting the adjustment degree of a parameter. For example, the adjustment degree information is an adjustment level, which may be a 1-level or a 2-level, or may also be an adjustment ratio value, such as 5 percent up or 10 percent down. That is, the target parameter information includes a target parameter value of at least one parameter, or target adjustment degree information of at least one parameter.

For example, there are many implementations for determining target parameter information by the receiving terminal based on the received signal, and the embodiments of the present disclosure are illustrated by the following two implementations.

Figure 10:
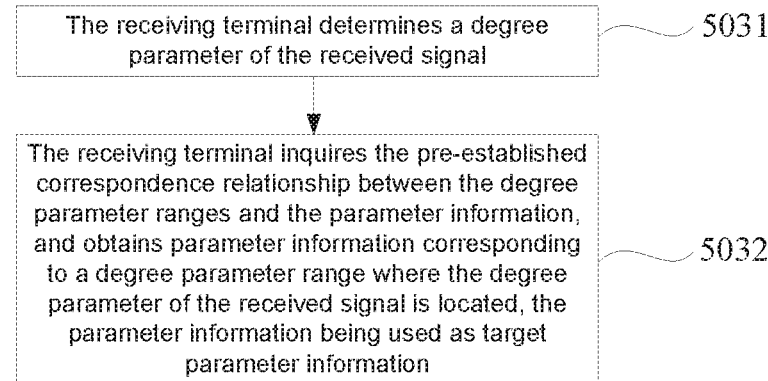
FIG. 10 is a flow diagram of a method for a receiving terminal to determine target parameter information, in accordance with some embodiments.

In a first implementation, the receiving terminal may determine the target parameter information by inquiring a correspondence table, and as shown in FIG. 10, the process may include the following steps.

In step 5031, the receiving terminal determines a degree parameter of the received signal.

The degree parameter is configured to reflect a severity of the transmission error in the received signal. For example, the degree parameter may be a packet loss rate, which may be calculated in the manner described in the step 5021. The higher the packet loss rate is, the more serious the transmission error in the signal received by the receiving terminal is. The degree parameter may also be a level, by which the severity of a transmission error in the signal is indicated. For example, a correspondence relationship between packet loss rate ranges and levels may be established. After the receiving terminal determines the packet loss rate of the received signal, the receiving terminal inquires the corresponding relationship between the packet loss rate ranges and the levels, and determines a level corresponding to a packet loss rate range where the packet loss rate is located. For example, it is assumed that the receiving terminal determines that the packet loss rate of the signal received through the transmission line is 30%, and obtains that the level corresponding to the packet loss rate range of 20%-40% where 30% is located is 2-level, then the receiving terminal determines that the degree parameter is level 2.

Of course, the degree parameter may also be other information, for example, the number of received data packets with a transmission error within a specified time, or the number of data packets with a transmission error in the received specified number of data packets, or the number of consecutive data packets with a transmission error in the specified number of received data packets, which is not limited by the embodiment of the present disclosure, as long as it may reflect the severity of the transmission error in the received signal.

In step 5032, the receiving terminal inquires the pre-established correspondence relationship between the degree parameter ranges and the parameter information, and obtains parameter information corresponding to a degree parameter range where the degree parameter of the received signal is located, the parameter information being used as target parameter information.

Each parameter information recorded in the correspondence relationship includes the first indication information of at least one parameter of the specified parameters, and the first indication information includes the target parameter value or the target adjustment degree information.

After the receiving terminal determines the degree parameter of the received signal, the receiving terminal determines a degree parameter range where the degree parameter is located, and obtains the target parameter value of at least one parameter corresponding to the degree parameter range, or the target adjustment degree information of the at least one parameter.

Figure 11:
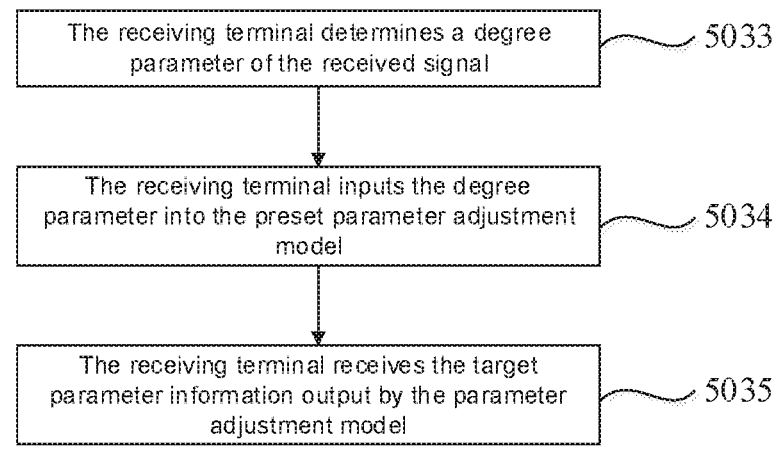
FIG. 11 is a flow diagram of another method for a receiving terminal to determine target parameter information, in accordance with some embodiments.

In a second implementation, the receiving terminal may determine target parameter information by pre-establishing a parameter adjustment model. As shown in FIG. 11, the process may include the following steps.

In step 5033, the receiving terminal determines a degree parameter of the received signal.

The degree parameter is configured to reflect the severity of the transmission error in the received signal. The process for the receiving terminal to determine the degree parameter of the received signal may refer to the above mentioned step 5031, and the embodiments of the present disclosure are not described in detail herein.

In step 5034, the receiving terminal inputs the degree parameter into the preset parameter adjustment model.

The parameter adjustment model is used for predicting parameter information corresponding to the degree parameter that is input into the parameter adjustment model.

In step 5035, the receiving terminal receives the target parameter information output by the parameter adjustment model.

For example, the parameter adjustment model may be established by a plurality of experiments. After the receiving terminal determines the degree parameter of the received signal, the receiving terminal inputs the degree parameter into the parameter adjustment model, and obtains the target parameter value or the target adjustment degree information of at least one parameter corresponding to the degree parameter obtained through the parameter adjustment model.

As described above, the specified parameters include first parameters adjustable by the transmitting terminal and second parameters adjustable by the receiving terminal. The target parameter information may include first indication information of the first parameters and/or first indication information of the second parameters. The first parameters include at least one of a driving current of the transmitting terminal, a swing level, and a slew rate. The second parameters include at least one of a swing level, an equalizer, a matching resistance of the receiving terminal, filtering parameters of a filter and a driving current of the receiving terminal. Based on contents of the target parameter information, the receiving terminal may perform the following steps.

In step 504, in a case where the target parameter information includes the first indication information of the first parameters, the receiving terminal sends first indication information of the first parameters to the transmitting terminal. Then step 505 is performed.

In some possible designs, in a case where the transmission line between the transmitting terminal and the receiving terminal may transmit signals in bi-directionally, the receiving terminal may directly send the first indication information of the first parameters to the transmitting terminal through the transmission line.

In a case where the transmission line between the transmitting terminal and the receiving terminal transmit signals unidirectionally, that is, signals can only be sent from the transmitting terminal to the receiving terminal on the transmission line, the receiving terminal needs to send the first indication information to the transmitting terminal in other manners. For example, an additional signal line is provided between the transmitting terminal and the receiving terminal for transmitting the first indication information. As an example of the implementation environment shown in FIGS. 1 and 2, a signal line L is provided between the transmitting terminal and the receiving terminal. In one implementation, signals on the signal line L may be transmitted bi-directionally, and the receiving terminal sends the first indication information of the first parameters to the transmitting terminal through the signal line L. In another implementation, since the signal line L may identify a level state, the receiving terminal may achieve an effect of making the first indication information of the first parameters known by the transmitting terminal by setting the level state on the signal line L high or low, which is equivalent to sending the first indication information of the first parameters to the transmitting terminal through the signal line L.

It will be noted that even the transmission line between the transmitting terminal and the receiving terminal may transmit signals bi-directionally, since the transmission line is currently in a state that signals are interfered, the first indication information transmitted by the receiving terminal through the transmission line is also easily interfered. Therefore, in order to ensure an effective transmission of the first indication information, the receiving terminal may also send the first indication information of the first parameters by adopting the above-mentioned additional signal line.

In step 505, the transmitting terminal adjusts the first parameters based on the first indication information of the received first parameters. Then step 507 is performed.

In step 506, in a case where the target parameter information includes the first indication information of the second parameters, the receiving terminal adjusts the second parameters based on the first indication information of the second parameters. Then step 508 is performed.

Referring to the step 503, the target parameter information includes the target parameter value of at least one parameter, or the target adjustment degree information of the at least one parameter.

In the first implementation, in a case where the target parameter information includes the target parameter value of at least one parameter, the steps 504 to 506 include: in a case where the target parameter information includes the target parameter values of the first parameters, sending, by the receiving terminal, the target parameter values of the first parameters to the transmitting terminal. Correspondingly, the transmitting terminal adjusts the first parameters based on the target parameter values of the first parameters, and the adjusting process includes: adjusting, by the transmitting terminal, the first parameters, so that the parameter values of the adjusted first parameters are equal to corresponding target parameter values of the target parameter information. In a case where the target parameter information includes target parameter values of the second parameters, the receiving terminal adjusts the second parameters based on the target parameter values of the second parameters, and the adjusting process is: adjusting, by the receiving terminal, the second parameters, so that the parameter values of the adjusted second parameter are equal to corresponding target parameter values of the target parameter information.

For example, in a case where the target parameter information includes the target parameter value of at least one parameter, the corresponding relationship of the degree parameter ranges and the target parameter values is shown in Table 1. Some embodiments of the present disclosure take Table 1 as an example to further describe steps 504 to 506. It is assumed that the receiving terminal determines that the degree parameter of the received signal is 45%, and determines that the degree parameter is in a range of 41%-60%. Then the receiving terminal inquires Table 1 to obtain that the target parameter information that corresponds to the range is as follows. The slew rate is e, the equalizer is f, and the filtering parameter of the filter is g. Then the receiving terminal sends the target parameter information in which the target parameter value of the slew rate is e to the transmitting terminal. The transmitting terminal adjusts the slew rate, so that the parameter value of the adjusted slew rate is equal to e. The receiving terminal adjusts the equalizer and the filtering parameter of the filter, so that the parameter value of the adjusted equalizer is equal to f, and the value of the filtering parameter of the adjusted filter is equal to g.

TABLE 1

| Degree parameter ranges | Target parameter values |
| --- | --- |
| 0~20% | The driving current of the transmitting terminal is a and the swing level is b |
| 21%~40% | The driving current of the transmitting terminal is c, and the matching resistance of the receiving terminal is d |
| 41%~60% | The slew rate is e, the equalizer is f, and the filtering parameter of the filter is g |
| 61%~80% | The equalizer is m and the driving current of the receiving terminal is n |
| 81%~100% | The slew rate is t and the matching resistance of the receiving terminal is k |

In the second implementation, in a case where the target parameter information includes the target adjustment degree information of at least one parameter, the steps 504 to 506 include: in a case where the target parameter information includes target adjustment degree information of the first parameters, sending, by the receiving terminal, the target adjustment degree information of the first parameters to the transmitting terminal. Correspondingly, the transmitting terminal adjusts the first parameters based on the target adjustment degree information of the first parameters. In a case where the target parameter information includes the target adjustment degree information of the second parameters, the receiving terminal adjusts the second parameters based on the target adjustment degree information of the second parameters.

For example, in a case where the target parameter information includes the target adjustment degree information of at least one parameter, the corresponding relationship of degree parameter range sand target adjustment degree information is shown in Table 2. Some embodiments of the present disclosure take Table 2 as an example to further describe the steps 504 to 506. For example, it is assumed that the target adjustment degree information is an adjustment proportion value, the receiving terminal determines that the degree parameter of the received signal is 45%, and the range where the degree parameter is located is 41%-60%. By inquiring Table 2, the receiving terminal obtains that the target parameter information that corresponds to the range is as follows. The slew rate is increased by e %, the equalizer is decreased by f %, and the filtering parameter of the filter is increased by g %. The receiving terminal sends the target parameter information in which the slew rate is increased by e % to the transmitting terminal, and the transmitting terminal adjusts the slew rate, so that the parameter value of the adjusted slew rate increases by e % over an initial value. The receiving terminal adjusts the equalizer and the filtering parameter of the filter, so that the parameter value of the adjusted equalizer decreases by f % over an initial value, and the parameter value of the filtering parameter of the adjusted filter increases by g % over an initial value.

TABLE 2

| Degree parameter ranges | Target adjustment degree information |
| --- | --- |
| 0~20% | The driving current of the transmitting terminal is increased by a %, and the swing level is increased by b % |
| 21%~40% | The driving current of the transmitting terminal is increased by c %, and the matching resistance of the receiving terminal is decreased by d % |
| 41%~60% | The slew rate is increased by e %, the equalizer is decreased by f %, and the filtering parameter of the filter is increased by g % |
| 61%~80% | The equalizer is increased by m %, and the driving current of the receiving terminal is increased by n % |
| 81%~100% | The slew rate is increased by t %, and the matching resistance of the receiving terminal is decreased by k % |

It will be noted that the Tables 1 and 2 are merely exemplary illustrations of some embodiments of the present disclosure. In actual implementations, the target parameter information of specified parameters may be determined according to requirements and experimental conditions, which is not limited by the embodiments of the present disclosure.

After at least one parameter in the specified parameters is adjusted by at least one of the transmitting terminal and the receiving terminal, in one possible implementation, the transmitting terminal and/or the receiving terminal keep parameter values of the adjusted specified parameters unchanged for subsequent signal transmission. In another possible implementation, after at least one parameter in the specified parameters is adjusted, for example, after some parameter values of the specified parameters are increased, power consumption of circuits at the transmitting terminal and at receiving terminal may be increased, thereby affecting lives of devices in the transmitting terminal and the receiving terminal. Therefore, in order to reduce the power consumption increased due to the adjustment of the specified parameters, the following steps 507 and 508 may be performed.

In step 507, when a restoration condition is reached, the transmitting terminal restores corresponding parameters in the specified parameters to initial setting.

The initial setting is a setting before the corresponding parameters of the specified parameters are adjusted. When the restoration condition is reached, the transmitting terminal restores the first parameters to the setting before adjustment. For example, the example shown in Table 1 is still used as an example for description. That is, in an example where the transmitting terminal adjusts the first parameter when the degree parameter is 45%, it is assumed that the initial setting of the slew rate is $e_0$, the transmitting terminal restores the parameter value of the slew rate from e to $e_0$ when the restoration condition is reached.

The restoration condition may include at least one of the following contents.

In a first restoration condition, a time interval between a current moment and an adjustment moment of the specified parameters is greater than a specified time interval.

For example, the specified time interval may be 5 minutes. After the transmitting terminal adjusts the first parameter, if the time interval between the current moment and the adjusting time of the first parameter is greater than 5 minutes, the first parameters may be restored to the initial setting. If the time interval between the current moment and the adjusting time of the first parameter is not greater than 5 minutes, the parameter value of the first parameter is unchanged. The above example is still taken as an example, the specified time interval is 5 minutes and the initial setting of the slew rate is $e_0$. After the slew rate is adjusted by the transmitting terminal, the parameter value of the adjusted slew rate is equal to e. If the time interval between the current moment and the adjustment time of the slew rate is greater than 5 minutes, the transmitting terminal may restore the parameter value of the slew rate to $e_0$. If the time interval between the current moment and the adjustment time of the slew rate is not greater than 5 minutes, the value parameter of the swing rate value is still e.

In a second restoration condition, the transmitting terminal is powered on again. For example, in a case where the transmitting terminal is powered on again, the first parameter is restored to the initial setting.

In step 508, when the restoration condition is reached, the receiving terminal restores the corresponding parameter of the specified parameters to the initial setting.

The initial setting is a setting before the corresponding parameter of the specified parameters are adjusted. For example, when the restoration condition is reached, the receiving terminal restores the second parameter to the setting before adjustment. The process of restoring the second parameter to the setting before adjustment by the receiving terminal may refer to the process of restoring the first parameter to the setting before adjustment by the transmitting terminal in the step 507, and the embodiments of the present disclosure will not be described in detail herein.

The restoration condition in the step 508 may include at least one of the following contents.

In a first restoration condition, the time interval between the current moment and the adjustment time of the specified parameters is greater than a specified time interval.

In a second restoration condition, the receiving terminal is powered on again. For example, in a case where the receiving terminal is powered on again, the second parameter is restored to the initial setting.

In the first manner, the receiving terminal may directly obtain the target parameter value or the target adjustment degree information of the parameter to be adjusted according to the corresponding relationship between severity ranges of the transmission error and the parameter information, and the specified parameter may be adjusted to an appropriate value without performing multiple adjustments, which simplifies the adjustment process and improves the efficiency of signal transmission.

In summary, in the signal transmission method provided by the embodiments of the present disclosure, in a case where the receiving terminal detects that there is a transmission error in the received signal, the target parameter information of the parameter to be adjusted may be directly obtained according to the corresponding relationship between the severity ranges of the transmission error and the parameter information. The receiving terminal controls at least one of the receiving terminal and the transmitting terminal to the adjust the parameter affecting the anti-interference capability of the signals on the transmission line according to the target parameter information, so that the anti-interference capability of the signals on the transmission line is improved, the signals on the transmission line are not easily lost in a case where the signals are subjected to external electromagnetic interference, and the accuracy of the signals received by the receiving terminal is improved. In a case where the restoration condition is reached, the parameter in the specified parameters may be restored to the setting before adjustment, so that the power consumption caused by adjustment of the specified parameters is effectively reduced, and lives of devices in the receiving terminal and the transmitting terminal are prolonged. In the adjustment process of the specified parameters, since the receiving terminal may be provided to automatically detect whether there is a transmission error in the received signal, and automatically control at least one of the receiving terminal and the transmitting end to adjust the parameter, the anti-interference capability of signals on the transmission line is better.

Figure 12:
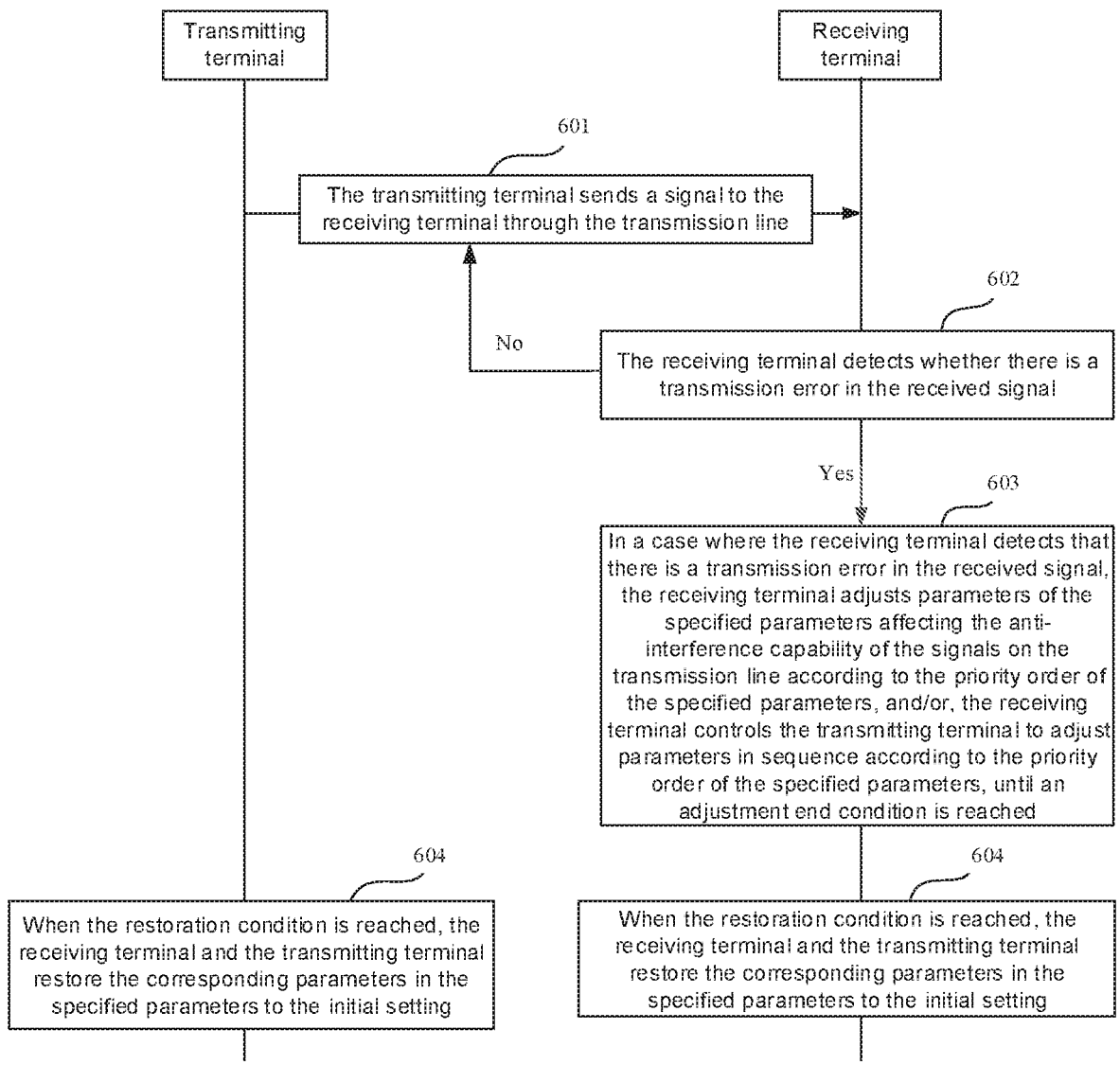
FIG. 12 is a flow diagram of yet another signal transmission method, in accordance with some embodiments.

In the second manner, the receiving terminal controls at least one of the receiving terminal and the transmitting terminal to adjust parameters according to a priority order of the specified parameters. For example, referring to FIG. 12, the signal transmission method may include the following steps.

In step 601, the transmitting terminal sends a signal to the receiving terminal through the transmission line. Then step 602 is performed.

The process of step 601 may be referred to the step 501, which is not described in details in the embodiment of the present disclosure.

In step 602, the receiving terminal detects whether there is a transmission error in the received signal.

In a case where the receiving terminal detects that there is a transmission error in the received signal, step 603 is performed. In a case where the receiving terminal detects that there is no transmission error in the received signal, step 601 is repeatedly performed.

The process of the step 602 may refer to the step 502 described above, and is not described in details in the embodiments of the present disclosure.

In step 603, in a case where the receiving terminal detects that there is a transmission error in the received signal, the receiving terminal adjusts parameters of the specified parameters affecting the anti-interference capability of the signals on the transmission line according to the priority order of the specified parameters, and/or, the receiving terminal controls the transmitting terminal to adjust parameters in sequence according to the priority order of the specified parameters, until an adjustment end condition is reached. Then step 604 is performed.

The adjustment end condition includes at least one of the following contents.

In the first condition, there is no transmission error in the received signal again sent by the transmitting terminal.

The process of detecting whether there is a transmission error in the signal received again that is sent by the transmitting terminal may refer to the step 502, and will not be described in detail herein in the embodiments of the present disclosure.

In the second condition, the adjustments of all the specified parameters are completed.

For example, after the receiving terminal controls at least one of the receiving terminal and the transmitting terminal to adjust all the specified parameters according to the priority order of the specified parameters, the adjustment end condition is reached, and the adjustment process is ended.

In the third condition, the adjustments of a specified number of parameters in the specified parameters are completed.

For example, since the process of adjusting parameters may be relatively long, and the time of signal interference is actually relatively short, a specified number may be set in advance, the time for adjusting the specified number of parameters is the adjustment time, and the adjustment performed in the adjustment time may quickly play an anti-interference part.

In the embodiments of the present disclosure, the priority order may be preset, or may be dynamically adjusted according to actual conditions, it may be randomly determined, or may be obtained through experience or experimental calculation.

In some embodiments, since the specified parameters described above include first parameters adjustable by the transmitting terminal and second parameters adjustable by the receiving terminal, after the receiving terminal receives the signal, if the receiving terminal directly adjusts the second parameters adjustable by itself, it does not need to control the transmitting terminal, which reduces a control flow. However, in the second parameters, since parameters such as the equalizer, the matching resistance of the receiving terminal and the filtering parameter of the filter need to be adjusted according to actual conditions, the adjustment process may need to be performed a plurality of times, and the adjustment period is relatively long. The swing level and the driving current of the receiving terminal may be directly adjusted in an increasing manner, and the adjusting period is short. Therefore, the second parameters may be divided into third parameters having a shorter adjustment period and fourth parameters having a longer adjustment period. The third parameters include at least one of the swing level and the driving current of the receiving terminal, and the fourth parameters include at least one of the equalizer, the matching resistance of the receiving terminal, and the filtering parameters of the filter.

In some possible designs, the adjustment period of the fourth parameters may be longer than the period for controlling the transmitting terminal to adjust the first parameters, and the adjustments of the fourth parameters are relatively complex. Therefore, the above priority order may be that the priorities of the third parameters are greater than the priorities of the first parameters, and the priorities of the first parameters are greater than the priorities of the fourth parameter. The greater the parameter values of the third parameters and the first parameters, the stronger the anti-interference capability of the signals.

According to the priority order, the receiving terminal may first adjust parameters that have a greater influence on the anti-interference capability of signals, and then adjust parameters that need to be adjusted according to actual conditions. In this way, in a case where the anti-interference capability of the signals on the transmission line may achieve a required effect by adjusting parameters with a higher priority, parameters with a lower priority does not need to be further adjusted, so that the adjusting process is simplified, and signal transmission efficiency is further improved.

Figure 13:
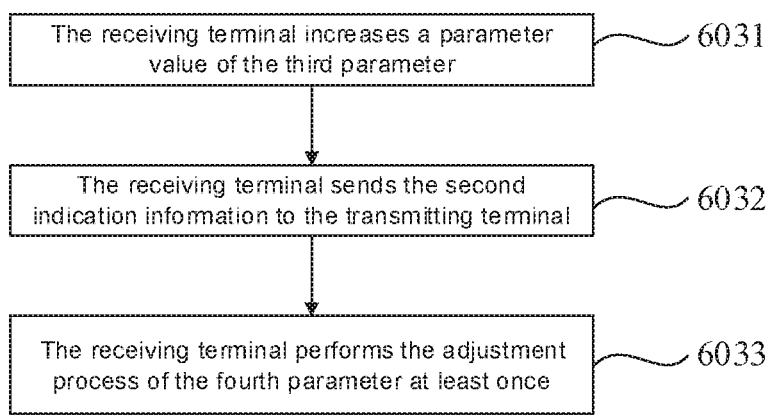
FIG. 13 is a flow diagram of a method for adjusting specified parameters, in accordance with some embodiments.

According to the priority order of the specified parameters, there are various manners of controlling at least one of the receiving terminal and the transmitting terminal to adjust parameters in sequence in the step 603. For example, referring to FIG. 13, at least one of the following steps 6031 to 6033 may be performed in the priority order.

In 6031, the receiving terminal increases a parameter value of the third parameter.

For example, the receiving terminal may gradually increase the parameter value of the third parameter. For example, the receiving terminal may gradually increase the parameter value of the third parameter by a certain proportion, and the certain proportion may be 10%, so as to improve the anti-interference capability of the signals. For example, the receiving terminal may also directly increase the parameter value of the third parameter to the maximum value, so that the anti-interference capability of signals may achieve the best effect.

In step 6032, the receiving terminal sends the second indication information to the transmitting terminal.

The second indication information is used for indicating the transmitting terminal to increase the parameter value of the first parameter. In a case where the transmitting terminal receives the second indication information, the parameter value of the first parameter is increased based on the second indication information.

For example, the transmitting terminal may gradually increase the parameter value of the first parameter. For example, the transmitting terminal may gradually increase the parameter value of the first parameter by a certain proportion, and the certain proportion may be 10%, so as to improve the anti-interference capability of signals. In some embodiments, the transmitting terminal may also directly increase the parameter value of the first parameter to the maximum value, so that the anti-interference capability of signals may achieve the best effect.

In step 6033, the receiving terminal performs the adjustment process of the fourth parameter at least once.

The adjustment process of the fourth parameter includes increasing or decreasing parameter value of the fourth parameter. The above process of adjusting the fourth parameter may be performed multiple times. After the adjustment process of the fourth parameter is performed once, if the anti-interference capability of the signals is reduced, then the adjustment process of the fourth parameter is performed again, and an adjustment direction of the adjustment process of the fourth parameter performed again is opposite to an adjustment direction of the adjustment process of the last fourth parameter. For example, after the adjustment process of the fourth parameter is performed once by increasing the value of the matching resistance of the receiving terminal, if the anti-interference capability of the signals is decreased, then the adjustment process of the fourth parameter is performed again by reducing the value of the matching resistance of the receiving terminal. If the anti-interference capability of the signals is improved after an adjustment process of the fourth parameter is performed once, then the adjustment process of the fourth parameter may be performed again, and the adjustment direction of the adjustment process of the fourth parameter performed again is the same as the adjustment direction of the adjustment process of the last fourth parameter. For example, after the adjustment process of the fourth parameter is performed once by increasing the value of the matching resistance of the receiving terminal, if the anti-interference capability of the signals is improved, then the adjustment process of the fourth parameter is performed again by increasing the value of the matching resistance of the receiving terminal.

In step 604, when the restoration condition is reached, the receiving terminal and the transmitting terminal restore the corresponding parameters in the specified parameters to the initial setting.

The process for the receiving terminal and the transmitting terminal to restore the corresponding parameters of the specified parameters to the initial settings may refer to the steps 507 and 508, and will not be described in detail herein.

In the second manner, the receiving terminal directly adjusts the parameters without performing actions such as table lookup, and/or, the receiving terminal controls the transmitting terminal to adjust parameters, the adjusting process is simple and rapid, and the adjusting efficiency is high.

It will be noted that the order of steps in the signal transmission method provided by some embodiments of the present disclosure may be appropriately adjusted. The steps may also be increased or decreased according to the conditions. Any person skilled in the art could easily conceive of changes within the technical scope disclosed in the present disclosure, which shall all be included in the protection scope of the present disclosure, and will not be described herein again.

In summary, in the signal transmission method provided by some embodiments of the present disclosure, in a case where the receiving terminal detects that there is a transmission error in the received signal, the receiving terminal may control at least one of the receiving terminal and the transmitting terminal to adjust parameters affecting the anti-interference capability of the signals on the transmission line according to the priority order of the specified parameters, which improves the anti-interference capability of the signals on the transmission line. In this way, the signals on the transmission line are not easily lost in a case where the signals are subjected to external electromagnetic interference, and the accuracy of the signals received by the receiving terminal is improved. In a case where the restoration condition is reached, parameters in the specified parameters may be restored to the setting before adjustment, so that the power consumption caused by adjustment of the specified parameters is effectively reduced, and lives of the devices in the receiving terminal and the transmitting terminal are prolonged. In the adjustment process of the specified parameters, since the receiving terminal may be provided to automatically detect whether there is transmission error in the received signal, and automatically control at least one of the receiving terminal and the transmitting end to adjust the parameters, the anti-interference capability of signals on the transmission line is better.

Figure 14:
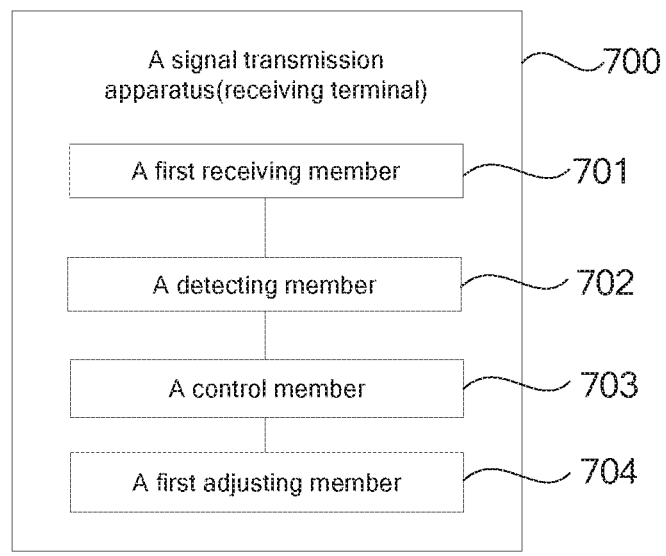
FIG. 14 is a block diagram of a signal transmission apparatus, in accordance with some embodiments.

Some embodiments of the present disclosure also provide a signal transmission apparatus applied to a receiving terminal. Referring to FIG. 14, the signal transmission apparatus 700 includes:

a first receiving member 701 configured to receive a signal sent by a transmitting terminal through a transmission line;

a detecting member 702 configured to detect whether there is a transmission error in the received signal; and a control member 703 and a first adjusting member 704.

The control member 703 is configured to control the first adjusting member 704 to adjust at least one parameter of specified parameters affecting an anti-interference capability of signals on the transmission line, and control the transmitting terminal to adjust at least one parameter of specified parameters affecting the anti-interference capability of signals on the transmission line.

The first adjusting member 704 is configured to adjust at least one parameter of the specified parameters affecting the anti-interference capability of signals on the transmission line under control of the control member 703.

In summary, in the signal transmission apparatus provided by the embodiments of the present disclosure, the receiving terminal receives the signal sent by the transmitting terminal through the first receiving member 701, and in a case where the receiving terminal detects that there is a transmission error in the received signal through the detecting member 702, the transmitting terminal controls at least one of the first adjusting member 704 and the transmitting terminal to adjust at least one parameter of the specified parameters affecting the anti-influencing capability of the signals on the transmission line through the control member 703, so that the anti-interference capability of signals on the transmission line is improved, signals on the transmission line are not easily lost in a case where the signals are subjected to external electromagnetic interference, and the accuracy of the signals received by the receiving terminal is improved.

In some embodiments, the control member 703 includes:

a determination sub-module used for determining target parameter information based on the received signal, the target parameter information including first indication information of at least one adjustable parameter of the specified parameters, and the first indication information including a parameter value or adjustment degree information; and a control sub-module used for controlling the first adjusting member 704 to adjust the parameter corresponding to the target parameter information according to the target parameter information, and/or, controlling the transmitting terminal to adjust the parameter corresponding to the target parameter information.

In some embodiments, the determination sub-module is used to:

Determine a degree parameter of the received signal, the degree parameter being used to reflect a severity of the transmission error in the received signal; and Inquire a pre-established correspondence relationship between degree parameter ranges and parameter information, and obtain parameter information corresponding to a degree parameter range where the degree parameter of the received signal is located, the parameter information being used as the target parameter information. Each parameter information recorded in the correspondence relationship includes the first indication information of at least one parameter of the specified parameters, and the first indication information includes the target parameter value or the target adjustment degree information.

In some possible designs, the specified parameters include first parameters adjustable by the transmitting terminal and second parameters adjustable by the receiving terminal. In a case where the first indication information includes the target parameter value, the control sub-module is used to:

in a case where the target parameter information includes the target parameter values of the first parameters, send the target parameter values of the first parameters to the transmitting terminal to control the transmitting terminal to adjust parameter values of the first parameters, so that the adjusted parameter values of the first parameters are equal to the corresponding target parameter values in the target parameter information; and in a case where the target parameter information includes the target parameter values of the second parameters, the target parameter values of the second parameters are sent to the first adjusting member 704 to control the first adjusting member 704 to adjust parameter values of the second parameters, so that the parameter values of the adjusted second parameters are equal to the corresponding target parameter values in the target parameter information.

In some embodiments, in a case where the first indication information includes the target adjustment degree information, the control sub-module is used to:

in a case where the target parameter information includes the target adjustment degree information of the first parameters, send the target adjustment degree information of the first parameters to the transmitting terminal to control the transmitting terminal to adjust the first parameters according to the corresponding target adjustment degree information in the target parameter information; and in a case where the target parameter information includes the target adjustment degree information of the second parameters, send the target adjustment degree information of the second parameters to the first adjusting member to control the first adjusting member to adjust the second parameters according to the corresponding target adjustment degree information in the target parameter information.

In some embodiments, the first parameters include at least one of a driving current of the transmitting terminal, a swing level, and a slew rate. The second parameters includes at least one of a swing level, an equalizer, a matching resistance of the receiving terminal, filtering parameters of the filter and a driving current of the receiving terminal.

In a second implementation, the first adjusting member 704 includes:

an adjustment sub-module used for controlling at least one of the receiving terminal and the transmitting terminal to adjust parameters according to a priority order of the parameters in the specified parameters until an adjustment end condition is reached.

In some embodiments, the adjustment end condition includes at least one of the following contents.

There is no transmission error in the signal received again sent by the transmitting terminal.

The adjustments of all the specified parameters are completed.

The adjustments of a specified number of parameters of the specified parameters are completed.

In some embodiments, the adjustment sub-module described above is used to:

according to the priority order of the specified parameters, perform at least one of:

increasing the parameter values of the third parameters;

sending the second indication information to the transmitting terminal, the second indication information being used for indicating the transmitting terminal to increase the parameter values of the first parameters.

performing the adjustment process of the fourth parameter at least once, the adjustment process of the fourth parameter including increasing or decreasing the parameter values of the fourth parameters.

The third parameters include at least one of a swing level and a driving current of the receiving terminal. The fourth parameters include at least one of an equalizer, a matching resistance of the receiving terminal and filtering parameters of a filter.

In the specified parameters, priorities of the third parameters are greater than priorities of the first parameters, and priorities of the first parameters are greater than priorities of the fourth parameters.

In some embodiments, a signal on the transmission line is transmitted in data packets, and the detecting member 702 is used to:

record a packet loss rate of the signal received through the transmission line, and determine that there is a transmission error in received signal in a case where the packet loss rate is greater than a specified packet loss rate threshold;

or, determine that there is a transmission error in the received signal in a case where the received data packets satisfy a specified condition. The specified condition include at least one of: a number of received data packets with a transmission error within a specified time being greater than a first specified number threshold; a number of data packets with a transmission error in the received specified number of data packets being greater than a second specified number threshold; and a number of data packets with consecutive transmission errors in the received specified number of data packets being greater than a third specified number threshold.

In some embodiments, the signal transmission apparatus 700 further includes:

a restoration member used for restoring the corresponding parameters in the specified parameters to initial setting when the restoration condition is reached after the parameters in the specified parameter are adjusted. The initial setting is a setting before the corresponding parameters of the specified parameters is adjusted.

For example, the restoration condition described above includes at least one of:

a time interval between a current time and an adjustment time of the specified parameters being greater than a specified time interval; and the transmitting terminal being powered on again.

In summary, in the signal transmission apparatus provided by the embodiments of the present disclosure, the receiving terminal receives the signal sent by the transmitting terminal through the first receiving member 701, and in a case where the receiving terminal detects that there is a transmission error in the received signal through the detecting component 702, at least one of the first adjusting member 704 and the transmitting terminal may be controlled by the control member 703 to adjust parameters affecting the anti-interference capability of signals on the transmission line, so that the anti-interference capability of signals on the transmission line is improved. Signals on the transmission line are not easily lost in a case where the signals are subjected to external electromagnetic interference, and the accuracy of the signals received by the receiving terminal is improved. In a case where the restoration condition is reached, the parameters in the specified parameters may be restored to the setting before adjustment, so that the power consumption caused by adjustment of the specified parameters is effectively reduced, and lives of the members in the receiving terminal and the transmitting terminal are prolonged. In the adjustment process of the specified parameters, since the receiving terminal may be able to set to automatically detect whether there is transmission error in the received signal, and automatically control at least one of the receiving terminal and the transmitting terminal to adjust, the anti-interference capability of signals on the transmission line is better.

In some embodiments, the control member 703 is further configured to send a control signal to the transmitting terminal in a case where there is a transmission error in the received signal to control the transmitting terminal to adjust at least one parameter of the specified parameters affecting the anti-influencing capability of signals on the transmission line.

Figure 15:
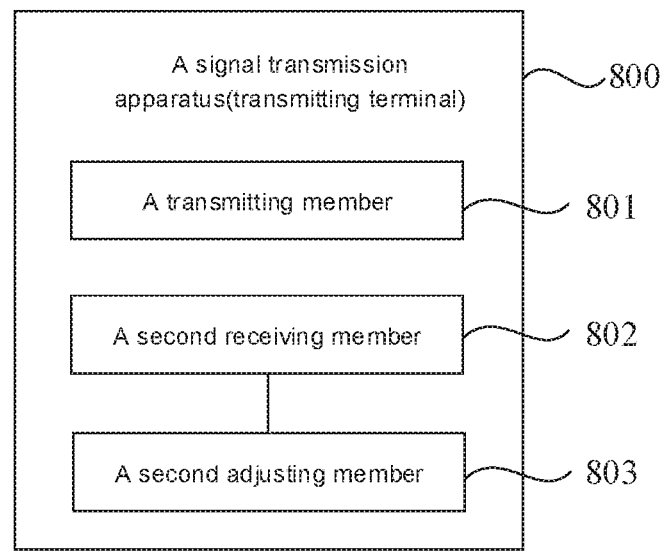
FIG. 15 is a block diagram of another signal transmission apparatus, in accordance with some embodiments.

Some embodiments of the present disclosure provide a signal transmission apparatus applied to a transmitting terminal. Referring to FIG. 15, the signal transmission apparatus 800 includes:

a transmitting member 801 configured to send a signal to a receiving terminal through a transmission line;

a second receiving member 802 configured to receive a control signal sent by a receiving terminal, the control signal being sent by the receiving terminal after it detects that there is a transmission error in the received signal; and a second adjusting member 803 configured to adjust at least one parameter of the specified parameters affecting the anti-influencing capability of signals on the transmission line based on the received control signal.

In summary, in the signal transmission apparatus provided in the embodiments of the present disclosure, the transmitting terminal sends a signal to a receiving terminal through the transmitting member 801. In a case where the receiving terminal detects that there is an error in the received signal, a control signal may be sent to the transmitting terminal. The transmitting terminal receives the control signal through the second receiving member 802, and adjusts the parameters affecting the anti-interference capability of signals on the transmission line based on the control signal through the second adjusting member 803, so that the anti-interference capability of signals on the transmission line is improved. The signals on the transmission line are not easily lost in a case where the signals are subjected to external electromagnetic interference, and the accuracy of the signals received by the receiving terminal is improved.

In a first implementation, the control signal is first indication information of the first parameters, the first parameters are parameters adjustable by the transmitting terminal of the specified parameters affecting the anti-interference capability of the signals on the transmission line, and the first indication information includes any one of target parameter values and target adjustment degree information.

In some embodiments, the second adjusting member 803 includes:

an adjusting sub-module used for adjusting the first parameters based on the received first indication information of the first parameters.

In a case where the first indication information includes the target parameter values, the adjusting sub-module is used to:

adjust the first parameters, so that parameter values of the adjusted first parameter are equal to the corresponding target parameter values.

In a case where the first indication information includes the target adjustment degree information, the adjustment sub-module is used to:

adjust the first parameters according to the target adjustment degree information.

In a second implementation, the control signal includes the second indication information. The second indication information is used to indicate the transmitting terminal to increase the parameter values of the first parameters. In this case, the control component is used to:

Increase the parameter values of the first parameters based on the second indication information.

In some embodiments, the first parameter includes at least one of a driving current of the transmitting terminal, a swing level, and a slew rate.

In some embodiments, the signal transmission apparatus 800 further includes:

a restoration member used to restore the parameters in the specified parameters to initial setting when the restoration condition is reached after the parameters in the specified parameter are adjusted. The initial setting is a setting before the corresponding parameters of the specified parameters are adjusted.

For example, the restoration condition described above includes at least one of:

a time interval between a current time and an adjustment time of the specified parameters being greater than a specified time interval; and the receiving terminal being powered on again.

In summary, in the signal transmission apparatus provided in the embodiments of the present disclosure, the transmitting terminal sends a signal to the receiving terminal. In a case where the receiving terminal detects that there is an error in the received signal, a control signal may be sent to the transmitting terminal. The transmitting terminal receives the control signal through the second receiving member, and adjusts the parameters affecting the anti-interference capability of the signals on the transmission line based on the control signal through the second adjusting member, so that the anti-interference capability of signals on the transmission line is improved. Signals on the transmission line are not easily lost in a case where the signals are subjected to external electromagnetic interference, and the accuracy of the signals received by the receiving terminal is improved. In a case where the restoration condition is reached, the parameters in the specified parameters may be restored to the setting before adjustment, so that the power consumption caused by adjustment of the specified parameters is effectively reduced, and lives of the devices in the receiving terminal and the transmitting terminal are prolonged.

It will be apparent to those skilled in the art that for convenience and brevity of description, specific working processes of the members of the signal transmission apparatus described above may refer to the corresponding processes in the foregoing embodiments, which will not be described in the embodiments of the present disclosure again.

Some embodiments of the present disclosure provide a signal transmission apparatus applied to a receiving terminal, and the signal transmission apparatus includes:

a memory configured to store executable instructions; and a processor configured to execute the executable instructions.

In a case where the processor executes the executable instructions, the processor may implement any signal transmission methods applied to the receiving terminal in the embodiments.

Some embodiments of the present disclosure provide a signal transmission apparatus applied to a transmitting terminal, and the signal transmission apparatus includes:

a memory configured to store executable instructions; and a processor configured to execute the executable instructions.

In a case where the processor executes the executable instructions, the processor may implement any signal transmission methods applied to the transmitting terminal in the embodiments.

The embodiment of the present disclosure provides a display device, and the display device includes a controller and a plurality of drivers. Each driver of the plurality of drivers is coupled to the controller through a transmission line. Each driver includes the signal transmission apparatus applied to the receiving terminal shown in FIG. 14. The controller includes the signal transmission apparatus applied to the transmitting terminal shown in FIG. 15. For example, the controller may also include the signal transmission apparatus applied to the receiving terminal shown in FIG. 14, and each driver may also include the signal transmission apparatus applied to the transmitting terminal shown in FIG. 15.

The controller may be disposed on a main board of the display device, and the driver may be disposed on an array substrate of the display device.

In some embodiments, the transmitting terminal and the receiving terminal are P2P interfaces in the display device. In some embodiments, the P2P interfaces in the display device are a timing controller and a source driver chip. In other embodiments, a graphics processor integrates with the function of the timing controller, in this case, the P2P interfaces in the display device are a graphics processor and a source driver chip.

Some embodiments of the present disclosure provide a display device, and the display device includes a controller and a plurality of drivers. Each driver of the plurality of drivers is coupled to the controller through a transmission line. Each driver includes the signal transmission apparatus as described in the embodiments above. The controller includes the signal transmission apparatus as described in the above embodiments.

Figure 16:
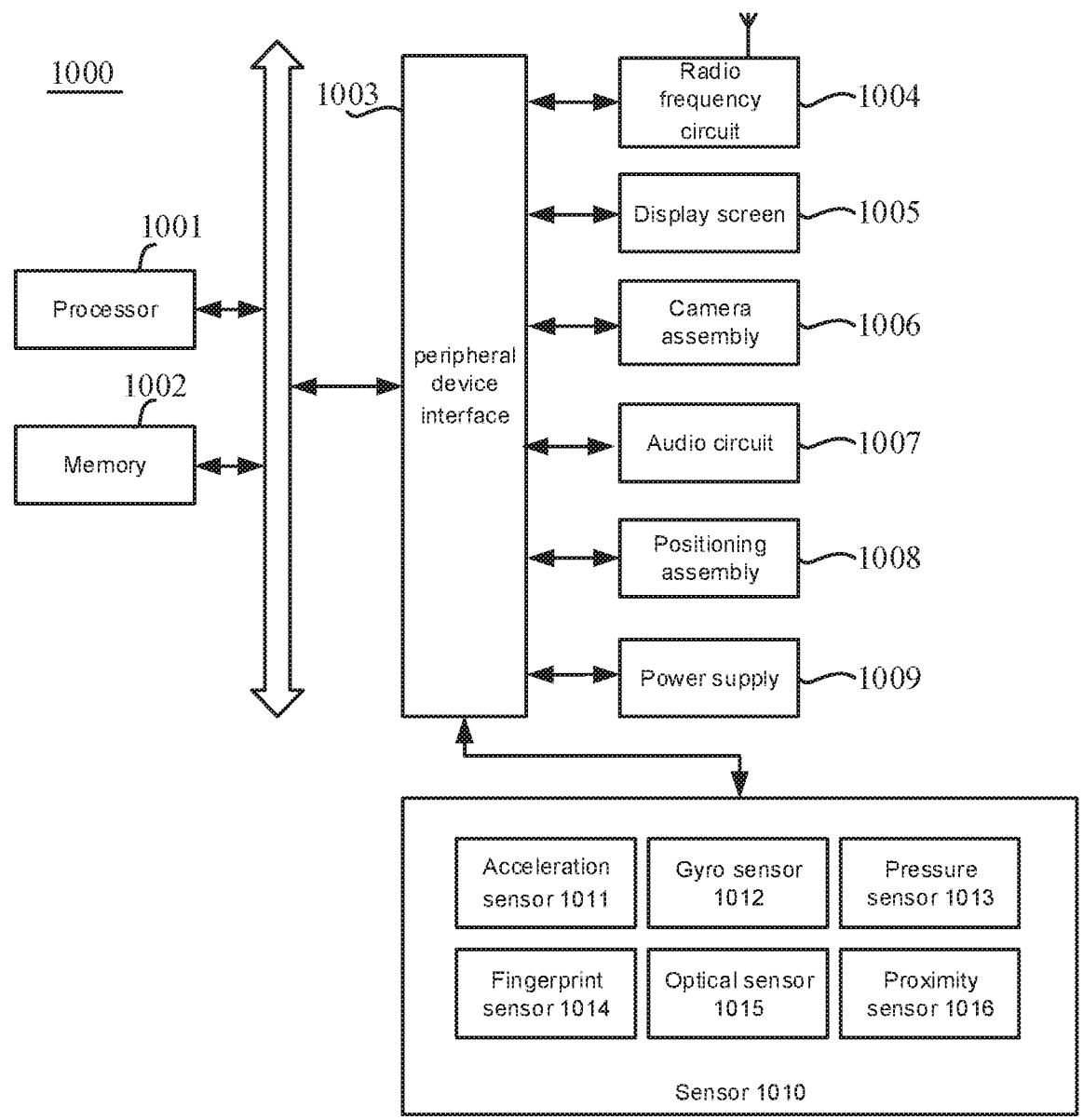
FIG. 16 is a schematic diagram showing a structure of a display device, in accordance with some embodiments.

The display device may be any product or component having a display function, such as a notebook computer, a television, a liquid crystal panel, electronic paper, an OLED panel, a mobile phone, a tablet computer, a display, a digital photo frame or a navigator. The controller in the display device may be at least one of a timing controller, a SOC, and a MCU. Referring to FIG. 16, the plurality of drivers in the display device may be source driver chips. Generally, the display device 1000 further includes a processor 1001 and a memory 1002. The memory 1002 is used to store executable computer instructions of the processor. The processor 1001 can perform one or more of the steps of the signal transmission method described in the embodiments above when it runs the computer instructions.

The processor 1001 may include one or more processing cores, such as a 4-core processor, or an 8-core processor. The processor 1001 may be implemented in at least one hardware form of digital signal processing (DSP), field-programmable gate array (FPGA), and programmable logic array (PLA). The processor 1001 may also include a main processor and a coprocessor. The main processor is a processor for processing data in a wake-up state, and is also called a central processing unit (CPU). The coprocessor is a low power consumption processor for processing data in a standby state. In some embodiments, the processor 1001 may be integrated with a graphics processing unit (GPU) that is used for rendering and drawing the content that the display device needs to display. In some embodiments, the processor 1001 may also include an artificial intelligence (AI) processor for processing computing operations related to machine learning.

The memory 1002 may include one or more computer-readable storage media, and the computer-readable storage medium may be non-transitory. The memory 1002 may also include a high-speed random access memory, and a non-volatile memory such as one or more disk storage devices, or flash memory storage devices. In some embodiments, a non-transitory computer-readable storage medium in the memory 1002 is used to store at least one instruction, and the at least one instruction is used to be execution by the processor 1001 to implement the signal transmission method provided by the embodiments of the present disclosure.

For example, referring to FIG. 16, the device 1000 may also include a peripheral device interface 1003 and at least one peripheral device. The processor 1001, the memory 1002, and the peripheral device interface 1003 may be connected through buses or signal lines. The peripheral devices may be connected to the peripheral device interface 1003 through buses, signal lines, or circuit boards. For example, the peripheral devices include at least one of a radio frequency circuit 1004, a display screen 1005, a camera assembly 1006, an audio circuit 1007, a positioning assembly 1008, and a power supply 1009.

The peripheral device interface 1003 may be used to connect at least one peripheral device related to Input/Output (I/O) to the processor 1001 and the memory 1002. In some embodiments, the processor 1001, the memory 1002, and the peripheral device interface 1003 are integrated into a same chip or circuit board. In some other embodiments, any one or two of the processor 1001, the memory 1002 and the peripheral device interface 1003 may be integrated into separate chips or circuit boards, which are not limited by the embodiments of the present disclosure.

For example, the radio frequency circuit 1004 is used to receive and transmit radio frequency (RF) signals, which are also known as electromagnetic signals. The radio frequency circuit 1004 communicates with communication networks and other communication devices through electromagnetic signals. The radio frequency circuit 1004 converts electrical signals into the electromagnetic signals for transmission, or converts the received electromagnetic signals into the electrical signals. In some embodiments, the radio frequency circuit 1004 includes an antenna system, a RF transceiver, one or more amplifiers, a tuner, an oscillator, a digital signal processor, a codec chipset, a subscriber identity module card and the like. The radio frequency circuit 1004 may communicate with other devices through at least one wireless communication protocol. The at least one wireless communication protocol includes, but is not limited to the world wide web, metropolitan area networks, intranets, generations of mobile communication networks (2G, 3G, 4G, and 5G), wireless local area networks, and/or WIFI networks. In some embodiments, the radio frequency circuit 1004 may also include NFC-related circuits, which is not limited by the embodiments of the present disclosure.

For example, the display screen 1005 is used to display a user interface (UI). The UI may include graphics, texts, icons, videos, and any combination thereof. In a case where the display screen 1005 is a touch display screen, the display screen 1005 also has the ability to collect touch signals on or above the surface of the display screen 1005. The touch signals may be input to the processor 1001 as control signals for being processed. In this case, the display screen 1005 may also be used to provide virtual buttons and/or virtual keyboards, also referred to as soft buttons and/or soft key boards. In some embodiments, there may be one the display screen 1005, which is disposed in the front of the display device 1000. In some other embodiments, there may be two display screen 1005, which are disposed on different surfaces of the display device 1000 or in a folded design. In some possible designs, the display screen 1005 may be a flexible display disposed on a curved surface or a folded surface of the display device 1000. For example, the display screen 1005 may also be arranged in a non-rectangular irregular pattern. That is, the display screen is a special shaped screen. The display screen 1005 may be made of a liquid crystal display (LCD), or an OLED, etc.

For example, the camera assembly 1006 is used to capture images or videos. In some embodiments, the camera assembly 1006 includes a front camera and a rear camera. Generally, the front camera is disposed on a front panel of the display device 1000, and the rear camera is disposed on a rear surface of the display device 1000. In some possible designs, there are at least two rear cameras, each of which is any one of a main camera, a depth-of-field camera, a wide-angle camera and a long-focus camera. The main camera and the depth-of-field camera are combined to realize a background blurring function. The main camera and the wide-angle camera are combined to realize panorama shooting and virtual reality (VR) shooting functions or other shooting functions. In some other embodiments, the camera assembly 1006 may also include a flash lamp. The flash lamp may be a monochrome temperature flash lamp or a dual color temperature flash lamp. The dual color temperature flash lamp refers to a combination of a warm light flash and a cold light flash, and may be used for light compensation in different color temperatures.

For example, the audio circuit 1007 may include a microphone and a speaker. The microphone is used for collecting sound waves of a user and environment, converting the sound waves into electric signals and inputting the electric signals to the processor 1001 for processing, or inputting to the radio frequency circuit 1004 for voice communication. There may be a plurality of microphones arranged at different positions of the display device 1000, so as to realize stereo collection or noise reduction. The microphones may also be array microphones, or the microphone may be omni-directional acquisition type microphones. The speaker is used to convert the electrical signals from the processor 1001 or radio frequency circuit 1004 into acoustic waves. The speaker may be a conventional membrane speaker or a piezoelectric ceramic speaker. In a case where the speaker is the piezoelectric ceramic speaker, it may not only convert the electric signals into sound waves audible to humans, but also convert the electric signals into sound waves inaudible to human for distance detection and other purposes. In some embodiments, the audio circuit 1007 may also include a headphone jack.

For example, the positioning assembly 1008 is used to locate the current geographic position of the display device 1000 to realize navigation or location based service (LBS). The positioning assembly 1008 may be a positioning assembly based on the global positioning system (GPS) of the United States or the BeiDou system of China or the Galileo system of Russia.

For example, the power supply 1009 is used to supply power to various assemblies in the display device 1000. The power supply 1009 may be an alternating current battery, a direct current battery, a disposable battery, or a rechargeable battery. In a case where the power supply 1009 includes a rechargeable battery, the rechargeable battery may be a wired rechargeable battery or a wireless rechargeable battery. The wired rechargeable battery is a battery charged through a wired line, and the wireless rechargeable battery is a battery charged through wireless coils. The rechargeable battery may also be used to support fast charge technology.

In some embodiments, referring to FIG. 16, the display device 1000 may also include one or more sensors 1010. The one or more sensors 1010 may include an acceleration sensor 1011, a gyro sensor 1012, a pressure sensor 1013, a fingerprint sensor 1014, an optical sensor 1015, and a proximity sensor 1016.

The acceleration sensor 1011 may detect a magnitude of acceleration on three coordinate axes of a coordinate system established by the display device 1000. For example, the acceleration sensor 1011 may be used to detect components of gravitational acceleration on the three coordinate axes. The processor 1001 may control the touch display screen 1005 to display a user interface in a lateral view or a longitudinal view according to gravity acceleration signals collected by the acceleration sensor 1011. The acceleration sensor 1011 may also be used for data collection of game play or user motion.

The gyro sensor 1012 may detect a body direction and a rotation angle of the display device 1000. The gyro sensor 1012 may cooperate with the acceleration sensor 1011 to collect user 3D motion on the display device 1000. The processor 1001 may realize the following functions according to the data collected by the gyro sensor 1012: motion sensing (such as changing UI according to a tilt operation of the user), image stabilization at shooting, game control, and inertial navigation.

The pressure sensor 1013 may be disposed at aside frame of the display device 1000 and/or a lower layer of the touch display screen 1005. In a case where the pressure sensor 1013 is disposed at the side frame of the display device 1000, the pressure sensor 1013 may detect holding signals of a user to the display device 1000, and the processor 1001 performs left-right hand recognition or quick operation according to the holding signals collected by the pressure sensor 1013. In a case where the pressure sensor 1013 is disposed at the lower layer of the touch display screen 1005, the processor 1001 controls operable control(s) on the UI interface according to the pressure operation of the user on the touch display screen 1005. The operable control(s) include at least one of a button control, a scroll bar control, an icon control and a menu control.

The fingerprint sensor 1014 is used to collect fingerprints of a user. An identity of the user is identified by the processor 1001 based on the fingerprints collected by the fingerprint sensor 1014. Or, the identity of the user is identified by the fingerprint sensor 1014 based on the collected fingerprints. In a case where the identity of the user is a trusted identity, the processor 1001 authorizes the user to perform relevant sensitive operations. The sensitive operations include unlocking the screen, viewing encryption information, downloading software, paying and changing settings and the like. The fingerprint sensor 1014 may be disposed in the front, back, or side of the display device 1000. In a case where a physical key or a manufacturer trademark is disposed on the display device 1000, the fingerprint sensor 1014 may be integrated with the physical key or the manufacturer trademark.

The optical sensor 1015 is used to collect an ambient light intensity. In some possible designs, the processor 1001 may control display luminance of the touch display screen 1005 based on the ambient light intensity collected by the optical sensor 1015. For example, in a case where the ambient light intensity is high, the display luminance of the touch display screen 1005 is increased. In a case where the ambient light intensity is low, the display luminance of the touch display screen 1005 is reduced. In other embodiments, the processor 1001 may also dynamically adjust the camera parameters of the camera assembly 1006 based on the ambient light intensity collected by the optical sensor 1015.

The proximity sensor 1016, also referred to as a distance sensor, is generally disposed in the front panel of the display device 1000. The proximity sensor 1016 is used to collect a distance between the user and the front of the display device 1000. In some embodiments, in a case where the proximity sensor 1016 detects that the distance between the user and the front of the display device 1000 gradually decreases, the processor 1001 controls the touch display screen 1005 to switch from a bright screen state to a dark screen state. In a case where the proximity sensor 1016 detects that the distance between the user and the front of the display device 1000 gradually increases, the processor 1001 controls the touch display screen 1005 to switch from the dark screen state to the bright screen state.

It will be understood by those skilled in the art that the structure shown in FIG. 16 does not limit the display device 1000, and the display device may include more or fewer assemblies than shown, or the combination of some assemblies, or the assemblies with a different arrangement.

The embodiments of the present disclosure provide a computer-readable storage medium. The computer-readable storage medium stores instructions. The instructions that, when run on the processing component, cause the processing component to perform any of the signal transmission methods described in the embodiments above.

The term "and/or" in present disclosure is merely an association relationship that describes related objects, meaning that there may be three relationships. For example, A and/or B may represent that: there are three cases of A alone, A and B simultaneously, and B alone.

Other embodiments of the present disclosure will be apparent to those skilled in the art after the specification and practice of the present disclosure disclosed herein are considered. The application is intended to cover any variations, uses, or adaptations of the present disclosure that conform to general principles of the present disclosure and include common knowledge or customary technical means in the art that are not disclosed in the present disclosure. It is intended that the specification and examples are considered as exemplary only, and the true scope and spirit of the present disclosure are indicated by the claims.

It will be understood that the present disclosure is not limited to the precise arrangements shown and described above, and various modifications and changes may be made without departing from the scope thereof. The scope of the present disclosure is limited only by the claims.

What is claimed is:

1. A signal transmission method applied to a receiving terminal, the signal transmission method comprising:
  receiving a signal sent by a transmitting terminal through a transmission line;
  detecting whether there is a transmission error in the received signal; and
  when there is a transmission error in the received signal, conducting one of the followings:
  determining target parameter information based on the received signal, wherein the target parameter information includes first indication information of at least one adjustable parameter of specified parameters, and the first indication information includes at least one target parameter value or target adjustment degree information; and
  according to the target parameter information, adjusting or controlling the transmitting terminal to adjust at least one parameter corresponding to the target parameter information; or, adjusting and controlling the transmitting terminal to adjust at least one parameter corresponding to the target parameter information;
  or,
  according to a priority order of the specified parameters, adjusting parameters that are adjustable by the receiving terminal sequentially until an adjustment end condition is reached; or, controlling the transmitting terminal to adjust parameters that are adjustable by the transmitting terminal sequentially until the adjustment end condition is reached; or adjusting parameters that are adjustable by the receiving terminal sequentially until an adjustment end condition is reached and controlling the transmitting terminal to adjust parameters that are adjustable by the transmitting terminal sequentially until the adjustment end condition is reached.

2. The signal transmission method according to claim 1, wherein
  determining the target parameter information based on the received signal, includes:
  determining a degree parameter of the received signal, wherein the degree parameter is configured to reflect a severity of the transmission error in the received signal;
  inquiring a pre-established corresponding relationship between degree parameter ranges and parameter information, and
  obtaining parameter information corresponding to a degree parameter range where the degree parameter of the received signal is located, the parameter information being used as the target parameter information, wherein each parameter information recorded in the corresponding relationship includes first indication information of at least one parameter of the specified parameters, and the first indication information includes at least one target parameter value or target adjustment degree information.

3. The signal transmission method according to claim 1, wherein the specified parameters include at least one first parameter adjustable by the transmitting terminal and at least one second parameter adjustable by the receiving terminal, and the first indication information includes at least one target parameter value; and
  according to the target parameter information, controlling the transmitting terminal to adjust at least one parameter corresponding to the target parameter information, includes:
  in a case where the target parameter information includes at least one target parameter value of the at least one first parameter, sending the at least one target parameter value of the at least one first parameter to the transmitting terminal to control the transmitting terminal to adjust at least one parameter value of the at least one first parameter, so that the at least one adjusted parameter value of the at least one first parameter is equal to a corresponding target parameter value in the target parameter information;
  according to the target parameter information, adjusting at least one parameter corresponding to the target parameter information, includes:
  in a case where the target parameter information includes at least one target parameter value of the at least one second parameter, adjusting at least one parameter value of the at least one second parameter, so that at least one adjusted parameter value of the at least one second parameter is equal to a corresponding target parameter value in the target parameter information.

4. The signal transmission method according to claim 1, wherein the specified parameters include at least one first parameter adjustable by the transmitting terminal and at least one second parameter adjustable by the receiving terminal, and the first indication information includes target adjustment degree information;

according to the target parameter information, controlling the transmitting terminal to adjust at least one parameter corresponding to the target parameter information, includes:

in a case where the target parameter information includes target adjustment degree information of the at least one first parameter, sending the target adjustment degree information of the at least one first parameter to the transmitting terminal to control the transmitting terminal to adjust the at least one first parameter according to corresponding target adjustment degree information of the target parameter information;

according to the target parameter information, adjusting at least one parameter corresponding to the target parameter information, includes:

in a case where the target parameter information includes target adjustment degree information of the at least one second parameter, adjusting the at least one second parameter according to corresponding target adjustment degree information of the target parameter information.

5. The signal transmission method according to claim 3, wherein the at least one first parameter includes at least one of a driving current of the transmitting terminal, a swing level, and a slew rate; and the at least one second parameter includes at least one of a swing level, an equalizer, a matching resistance of the receiving terminal, filtering parameters of a filter and a driving current of the receiving terminal.

6. The signal transmission method according to claim 1, wherein the adjustment end condition includes at least one of:

there being no transmission error in a signal received again sent by the transmitting terminal;

adjustment of all the specified parameters being completed; and adjustment of a specified number of parameters of the specified parameters being completed.

7. The signal transmission method according to claim 1, wherein according to the priority order of the specified parameters, adjusting parameters that are adjustable by the receiving terminal sequentially; or, controlling the transmitting terminal to adjust parameters that are adjustable by the transmitting terminal sequentially; or, adjusting parameters that are adjustable by the receiving terminal sequentially and controlling the transmitting terminal to adjust parameters that are adjustable by the transmitting terminal sequentially, includes:

according to the priority order of the specified parameters, performing at least one of:

increasing at least one parameter value of at least one third parameter;

sending second indication information to the transmitting terminal, the second indication information being configured to indicate the transmitting terminal to increase at least one parameter value of at least one first parameter; and performing adjustment process of at least one fourth parameter at least once, the adjustment process of the at least one fourth parameter including increasing or decreasing at least one parameter value of the at least one fourth parameter, wherein the at least one third parameter includes at least one of a swing level and a driving current of the receiving terminal, the at least one first parameter includes at least one of a driving current of the transmitting terminal, a swing level and a slew rate, and the at least one fourth parameter includes at least one of an equalizer, a matching resistance of the receiving terminal and filtering parameters of a filter, in the specified parameters, a priority of the at last one third parameter is greater than a priority of the at least first parameter, and the priority of the at least one first parameter is greater than a priority of the at least one fourth parameter.

8. The signal transmission method according to claim 1, wherein the signal is transmitted on the transmission line in a form of data packets;

detecting whether there is a transmission error in the received signal includes any one of following two combinations:

a, recording a packet loss rate of the signal received through the transmission line, and determining that there is a transmission error in the received signal when the packet loss rate is greater than a specified packet loss rate threshold;

b, determining that there is a transmission error in the received signal when received data packets satisfy a specified condition;

the specified condition includes at least one of:

a number of received data packets with a transmission error within a specified time being greater than a first specified number threshold;

a number of data packets with a transmission error in a received specified number of data packets being greater than a second specified number threshold; and a number of consecutive data packets with a transmission error in a received specified number of data packets being greater than a third specified number threshold.

9. The signal transmission method according to claim 1, wherein the signal transmission method further comprising:

after the at least one parameter of the specified parameters is adjusted, restoring corresponding at least one parameter of the specified parameters to initial setting when a restoration condition is reached, the initial setting being a setting before the corresponding at least one parameter of the specified parameters is adjusted;

the restoration condition includes at least one of:

a time interval between a current moment and an adjusting moment of the specified parameters being greater than a specified time interval, and the receiving terminal being powered on again.

10. A signal transmission method applied to a transmitting terminal, the signal transmission method comprising:

sending a signal to a receiving terminal through a transmission line;

receiving a control signal sent by the receiving terminal, the control signal being sent by the receiving terminal after a transmission error in a received signal is detected; and adjusting at least one parameter of specified parameters affecting an anti-interference capability of signals on the transmission line based on the received control signal; wherein the control signal includes first indication information of at least one first parameter, each first parameter is a parameter adjustable by the transmitting terminal in the specified parameters affecting the anti-interference capability of the signals on the transmission line, and the first indication information includes at least one target parameter value or target adjustment degree information;

adjusting at least one parameter of the specified parameters affecting the anti-interference capability of signals on the transmission line based on the received control signal, includes:

adjusting the at least one first parameter based on first indication information of the at least one first parameter included in the received control signal.

11. The signal transmission method according to claim 10, wherein the first indication information includes at least one target parameter value, and adjusting the at least one first parameter based on the first indication information of the at least one first parameter included in the received control signal, includes:

adjusting the at least one parameter value of the at least one first parameter, so that adjusted at least one parameter value of the at least one first parameter is equal to the at least one target parameter value included in the received first indication information.

12. The signal transmission method according to claim 10, wherein the first indication information includes target adjustment degree information;

adjusting the at least one first parameter based on the first indication information of the at least one first parameter included in the received control signal, includes:

adjusting the at least one first parameter according to the target adjustment degree information included in the received first indication information.

13. A signal transmission method applied to a transmitting terminal, the signal transmission method comprising:

sending a signal to a receiving terminal through a transmission line;

receiving a control signal sent by the receiving terminal, the control signal being sent by the receiving terminal after a transmission error in a received signal is detected; and adjusting at least one parameter of specified parameters affecting an anti-interference capability of signals on the transmission line based on the received control signal; wherein the control signal includes second indication information of the at least one first parameter, each first parameter is a parameter adjustable by the transmitting terminal in the specified parameters affecting the anti-interference capability of the signals on the transmission line, and the second indication information is configured to indicate the transmitting terminal to increase at least one parameter value of the at least one first parameter; and adjusting at least one parameter of the specified parameters affecting the anti-interference capability of signals on the transmission line based on the received control signal, includes:

increasing the at least one parameter value of the at least one first parameter based on second indication information of the at least one first parameter included in the received control signal.

14. The signal transmission method according to claim 10, wherein the signal transmission method further comprising:

after the at least one parameter of the specified parameters is adjusted, restoring a corresponding parameter of the specified parameters to initial setting when a restoration condition is reached, the initial setting being a setting before the corresponding parameter of the specified parameters is adjusted, wherein the restoration condition includes at least one of:

a time interval between a current moment and an adjusting moment of the specified parameters being greater than a specified time interval, and the receiving terminal being powered on again.

15. A signal transmission apparatus applied to a receiving terminal, the signal transmission apparatus comprising:

a memory configured to store executable instructions; and a processor configured to execute the executable instructions to perform one or more steps in the signal transmission method according to claim 1.

16. A signal transmission apparatus applied to a transmission terminal, the signal transmission apparatus comprising:

a memory configured to store executable instructions; and a processor configured to execute the executable instructions to perform one or more steps in the signal transmission method according to claim 10.

17. A non-transitory computer-readable storage medium storing instructions that, when run on a processing component, cause the processing component to perform the signal transmission method according to claim 1.

18. The signal transmission method according to claim 13, wherein the signal transmission method further comprising:

after the at least one parameter of the specified parameters is adjusted, restoring a corresponding parameter of the specified parameters to initial setting when a restoration condition is reached, the initial setting being a setting before the corresponding parameter of the specified parameters is adjusted, wherein the restoration condition includes at least one of:

a time interval between a current moment and an adjusting moment of the specified parameters being greater than a specified time interval, and the receiving terminal being powered on again.

* * * * *